(12) United States Patent
Hazelton et al.

(10) Patent No.: US 6,208,045 B1
(45) Date of Patent: Mar. 27, 2001

(54) ELECTRIC MOTORS AND POSITIONING DEVICES HAVING MOVING MAGNET ARRAYS AND SIX DEGREES OF FREEDOM

(75) Inventors: Andrew J. Hazelton, San Carlos; Michael B. Binnard, Belmont; Jean-Marc Gery, Beverly Hills, all of CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/192,813

(22) Filed: Nov. 16, 1998

(51) Int. Cl.$^7$ ................................................ H01L 21/00
(52) U.S. Cl. ............................................. 310/12; 414/935
(58) Field of Search ............................ 310/12; 318/135; 33/1 M; 74/471 XY; 108/137, 138; 29/721, 760, 785; 414/935, 936

(56) References Cited

U.S. PATENT DOCUMENTS

| | | | |
|---|---|---|---|
| Re. 27,289 | 2/1972 | Sawyer | 318/38 |
| Re. 27,436 | 7/1972 | Sawyer | 318/135 X |

(List continued on next page.)

FOREIGN PATENT DOCUMENTS

| | | |
|---|---|---|
| 62-100161 | 5/1987 | (JP) . |
| 2-168846 | 6/1990 | (JP) . |
| 3-178747 | 8/1991 | (JP) . |
| 4-125055 | 4/1992 | (JP) . |
| 7-060581 | 3/1995 | (JP) . |
| 7-131966 | 5/1995 | (JP) . |

OTHER PUBLICATIONS

Trumper et al. "Design and Analysis Framework for Linear Permanent Magnet Machines" (1994) *IEEE* 216–223 (Month Unknown).
Trumber et al "Magnet Aarrays for Synchronous Machines" (1993) *IEEE* 9–18 (Month Unknown).

*Primary Examiner*—Clayton LaBalle
*Assistant Examiner*—Judson H. Jones
(74) *Attorney, Agent, or Firm*—Morrison & Foerster LLP

(57) ABSTRACT

A two-dimensional electric motor having a moving magnet and positionable in six degrees of freedom. The electric motor has a coil array and a magnet array. The magnet array has a smaller width than the coil array in the moving magnet embodiment. The invention's process of achieving motion of a coil array with respect to a magnet array in six degrees of freedom includes providing an electrical current distribution to a coils. The motion is controlled in a first direction and a vertical direction between a portion of the coils and a portion of the magnet array. The electrical current distribution has two wavelike components having a same period but approximately ninety degrees out of phase. The invention's positioning devices do not require air bearings. Instead, the suspension of the support member by magnetic attraction to the frame or by interaction of the coil array and the magnet array replace the air bearings. The invention's electric motors and positioning devices should be useful in positioning wafers during semiconductor manufacture.

74 Claims, 12 Drawing Sheets

U.S. PATENT DOCUMENTS

| | | | |
|---|---|---|---|
| 3,851,196 | 11/1974 | Hinds | 310/12 |
| 3,878,411 | 4/1975 | Nocito et al. | 310/12 |
| 4,049,983 | 9/1977 | Attwood et al. | 310/13 |
| 4,151,447 | 4/1979 | von der Heide et al. | 318/135 |
| 4,485,339 | 11/1984 | Trost | 318/640 |
| 4,535,278 | 8/1985 | Asakawa | 318/687 |
| 4,555,650 | 11/1985 | Asakawa | 318/135 |
| 4,607,167 | 8/1986 | Petric | 250/492.2 |
| 4,626,749 | 12/1986 | Asakawa | 318/135 |
| 4,654,571 | 3/1987 | Hinds | 318/687 |
| 4,705,956 | 11/1987 | Ward | 250/492.2 |
| 4,706,007 | 11/1987 | Nagasaka | 318/687 |
| 4,742,286 | 5/1988 | Phillips | 318/640 |
| 4,786,832 | 11/1988 | Nakagawa et al. | 310/12 |
| 4,952,858 | 8/1990 | Galburt | 318/647 |
| 4,958,115 | 9/1990 | Miller | 318/662 |
| 5,015,622 | 5/1991 | Ward et al. | 310/12 X |
| 5,126,648 | 6/1992 | Jacobs | 318/640 |
| 5,196,745 | 3/1993 | Trumper | 310/12 |
| 5,208,497 | 5/1993 | Ishii et al. | 310/12 |
| 5,294,854 | 3/1994 | Trumper | 310/90.5 |
| 5,309,049 | 5/1994 | Kawada et al. | 310/12 |
| 5,334,892 | 8/1994 | Chitayat | 310/12 |
| 5,352,946 | 10/1994 | Hoffman et al. | 310/12 |
| 5,360,470 | 11/1994 | Ono et al. | 104/284 |
| 5,477,304 | 12/1995 | Nishi | 355/53 |
| 5,504,407 | 4/1996 | Wakui et al. | 318/568.17 |
| 5,528,118 | 6/1996 | Lee | 318/568.17 |
| 5,574,556 | 11/1996 | Mori et al. | 356/244 |
| 5,623,853 | 4/1997 | Novak et al. | 74/490.09 |
| 5,666,038 | 9/1997 | Ohishi | 318/625 |
| 5,715,037 | 2/1998 | Saiki et al. | 356/401 X |
| 5,773,837 | 6/1998 | Nakasuji | 250/412.23 |

ELECTRIC MOTORS AND POSITIONING DEVICES HAVING MOVING MAGNET ARRAYS AND SIX DEGREES OF FREEDOM

TECHNICAL FIELD

This invention relates generally to electric motors and more particularly to two-dimensional electric motors.

BACKGROUND ART

Electric motors are used in a variety of electrical equipment. For example, linear electric motors produce electrical power propelling an armature in one dimension. Wafer stages utilize linear electric motors to position a wafer during photolithography and other semiconductor processing.

A typical one-dimensional linear electric motor has a magnet track with pairs of opposing magnets facing each other. (Copending U.S. Ser. No. 09/059,056, entitled "Linear Motor Having Polygonal-Shaped Coil Unit" filed on Apr. 10, 1998, by Hazelton et al. discusses one-dimensional linear electric motors and is incorporated herein by reference in its entirety.) Within spaces between the pairs of opposing magnets, an armature moves. The armature has windings of a conductor which are connected to an electrical current. When the electrical current is turned on, the electric current interacts with the magnetic fields of the magnet pairs to exert force on the armature, causing the armature to move. When the armature is attached to a wafer stage, the wafer stage experiences the same force as and moves in concert with the armature.

In a multiphase motor, the armature has various windings grouped into phases. The electric currents are selected applied to the phase groups to create a more efficient motor. As the armature moves within the magnet track as current is applied to a first group of coils, the first group moves out of its optimal position between the pairs of magnets. Then, it becomes more efficient to apply current to a second group of windings. More phase groups are theoretically more efficient since a more even application of force and utilization of power input is maintained. However, each additional phase group complicates a timing of the applied current to the various phase groups. Presently, three-phase motors and armatures have gained favor in balancing these considerations.

Linear two-dimensional motors are also used in manufacturing. (U.S. Pat. No. 4,654,571, entitled "Single Plane Orthogonally Moveable Drive System," issued to Hinds on Mar. 31, 1987 ("Hinds") and U.S. Pat. No. 4,535,278, entitled "Two-Dimensional Precise Positioning Device for Use in a Semiconductor Manufacturing Apparatus," issued to Asakawa on Aug. 13, 1985 discuss two-dimensional linear electric motors and are incorporated herein by reference in their entireties.) The motors are two-dimensional in that they have two-dimensional arrays of magnets and armatures instead of magnet tracks and one-dimensional armatures. However, the magnet arrays and two-dimensional armatures may move with respect to each other in more than two dimensions depending upon the design. Conventional two-dimensional linear motors typically have an array of magnets and an armature having one or more coils on one side of the array of magnets.

U.S. Pat. No. 5,623,853, entitled "Precision Motion Stage with Single Guide Beam and Follower Stage," issued to Novak et al. on Apr. 29, 1997 and U.S. Pat. No. 5,528,118, entitled "Guideless Stage With Isolated Reaction Stage," issued to Lee on Jun. 18, 1996 discuss examples of semiconductor fabrication equipment and are incorporated herein by reference in their entireties.

When attached to part of a two-dimensional linear motor, a platform can be moved in two or more dimensions by the motor. For example, a wafer stage in semiconductor processing equipment may be attached to an armature or magnet array of a two-dimensional motor and the two-dimensional motor would control positioning of the wafer stage.

When used to position a platform, conventional two-dimensional electric motors do not smoothly and accurately position the platform. Presently, coils in the two-dimensional electric motors move with respect to the magnets. As exemplified in U.S. Pat. No. 4,654,571, entitled "Single Plane Orthogonally Moveable Drive System" issued to Hinds on Mar. 31, 1987, referenced above and incorporated herein by reference in its entirety, cables and hoses are attached to the coil assembly. The cables are for electrical current and the hoses may be used to carry coil cooling fluid or air supply. Unfortunately, the hoses and cables impede free motion of the coil assembly. If the hoses could be eliminated, the stability of motion of the motor and positioning of the platform would be improved.

Also, conventional technology relies upon cumbersome stacked arrangements to achieve six degrees of freedom movement of the platform. The six degrees of freedom include three translational and three rotational degrees of freedom. (Richard P. Feynman, Robert B. Leighton, and Matthew Sands, *The Feynman Lectures on Physics,* Addison-Wesley, 1962, discusses translational and rotational motion and degrees of freedom and is incorporated herein by reference in its entirety.) Unfortunately, many designs obtain six degrees of freedom by essentially stacking multiple two dimensional and/or one dimensional motors which move only in two dimensions within a plane. (U.S. Pat. No. 5,623,853, entitled "Precision Motion Stage with Single Guide Beam and Follower Stage" issued to Novak et al. on Apr. 29, 1997, discusses examples of such stacked arrangements and is incorporated herein by reference in its entirety.) For example, a platform may be propelled back and forth in one dimension under the control of linear electric motors. The linear electric motors are part of a holder which holds the platform. In turn, a second holder holds that entire holder and platform arrangement via joint connections and propels it back and forth in a second dimension by another set of linear electric motors. Additional degrees of motion may be provided by voice coil motors which are attached to these holders.

These types of stacked arrangements have a few drawbacks. Each additional holder enabling more degrees of freedom also adds mass requiring additional power for the electric motors to move the platform. Also, the complicated joint connections degrade accuracy of positioning of the platform and build-in resonant frequencies.

The platforms need a better electric motor to position them. The improved electric motor would eliminate the air hoses and position the platform in multiple degrees of freedom without the cumbersome stacked arrangements.

SUMMARY OF THE INVENTION

The invention features a moving magnet array or a moving coil array electric motor. The electric motor includes a magnet array and a coil array. The magnet array has a magnet array width and also a first period in a first direction and a second period in a second direction. The coil array has a coil array width which is larger than the magnet array width. The coil array interacts with the magnet array to provide motion of the magnet array relative to the coil array in the first direction and the second direction, and a third direction away from the coil array. Although the present invention is described in terms of a moving magnet array electric motor, the electric motor may be modified to be a moving coil array electric motor wherein the coil array moves relative to the magnet array.

The invention also features a process of achieving motion of a coil array with respect to a magnet array in six degrees of freedom. In some embodiments, the process includes positioning a coil of a periodic coil array in proximity to and overlapping a magnet of a periodic magnet array. The process also includes controlling a separation between a portion of the coil array and a portion of the magnet array. The controlling is achieved by the interaction of current in the coil and a magnetic field associated with the magnet.

In some embodiments, the method includes providing an electrical current distribution to a coil to control movement of the coils with respect to a magnetic field array. The motion is controlled in a first direction and a vertical direction between a portion of the coils and a portion the magnet array. The electrical current distribution has two wavelike components having a same period but approximately ninety degrees out of phase. The coils are distributed in a first direction with a coil period of approximately half the same period, and magnets in the magnet array are distributed in the first direction with magnet period of approximately 4/3 the coil period.

The invention also features positioning devices. The positioning device has a support member, a magnet array, and a coil array. In some embodiments, the magnet array is on the support member and has a magnet array width. The magnet array and the coil array are part of an electric motor. The electric motor is capable of positioning the support member in at least three degrees of freedom. In some embodiments, the coil array and the magnet array interact to suspend the support member. In other embodiments, the positioning device also includes a frame, and the support member is magnetically attracted to the frame to suspend the support member.

An advantage of the invention's moving magnet electric motor and corresponding positioning device is that they provide more stable positioning than conventional moving coil electric motors. The moving magnet electric motor does not require wire connections or cooling hoses to the moving part of the motor. Conventional two-dimensional electrical motors are "moving coil" motors having wires and cooling hoses connected to a moving coil array. Instead, the invention's electric motor has a moving magnet array. By eliminating the wires and hoses, positioning devices using the moving magnet array are more stable than conventional moving coil platforms.

Another advantage of the invention's positioning devices is that some embodiments do not require air bearings. Instead, the suspension of the support member by magnetic attraction to the frame or by interaction of the coil array and the magnet array replace the air bearings.

An advantage of one embodiment in the invention's method is that the method permits six degree of freedom positioning of the support member attached to either the electric motor's coil array or magnet array. The method appropriately commutates coils instead of using stacked stages or limited movement adaptations of one dimensional motors. Thus, the invention has a smoother more precise movement and a wider range of movement than conventional six degree of freedom positioning apparatuses. The method applies to both moving magnet and moving coil embodiments of the coil array.

The invention's electric motors and positioning devices should be useful in environments requiring precise and wide ranges of positioning. In particular, the invention should be particularly useful in positioning wafers during semiconductor manufacture.

These and other objects, features, and advantages of the invention will become readily apparent to those skilled in the art upon a study of the following drawings and a reading of the description of the invention below.

DESCRIPTION OF THE INVENTION

For background material, the reader is directed to the following standard textbooks all of which are incorporated herein by reference in their entireties: *Permanent-Magnet DC Linear Motors*, A. Basak, Clarendon Press, 1996; R. P. Feynman, R. B. Leighton and M. Sands, *Feynman Lectures on Physics*, Addison-Wesley, 1962; *Fundamentals of Physics*, Second Edition, Extended Version, Revised Printing, David Halliday and Robert Resnick, John Wiley & Sons, 1986; *Brushless Permanent-Magnet Motor Design*, D. C. Hanselman, McGraw-Hill, 1994; *Design of Brushless Permanent-Magnet Motors*, J. R. Hendershot, Jr. and T. J. E. Miller, Magna Physics Publishing and Clarendon Press, 1994; E. M. Purcell, *Electricity and Magnetism*, McGraw-Hill 1965. Additional background material may be found in U.S. Pat. Nos. 5,196,745, entitled "Magnet Positioning Device", issued to Trumper on Mar. 23, 1993; 4,535,278, entitled "Two-Dimensional Precise Positioning Device for Use in a Semiconductor Manufacturing Apparatus", issued to Asakawa on Aug. 13, 1985; 4,654,571, entitled "Single Plane Orthogonally Moveable Drive System" issued to Hinds on Mar. 31, 1987, referenced above; and 5,334,892, entitled "Positioning Device for Planar Positioning" issued to Chitayat on Aug. 2, 1994 all of which are incorporated herein by reference in their entireties.

Figure 1A:
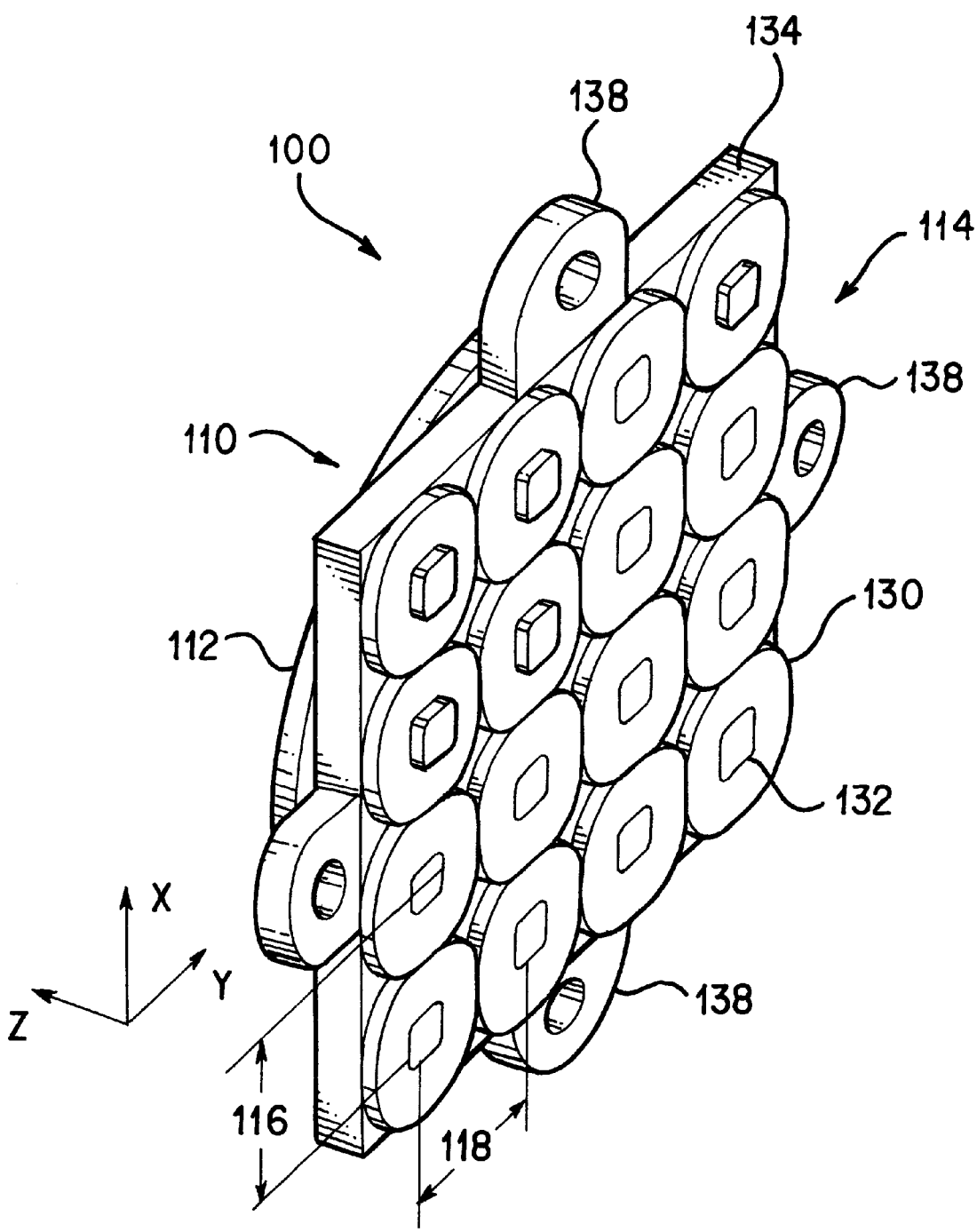
FIGS. 1A–1C illustrate components of a moving coil electric motor in accordance with the present invention.
Figure 1B:
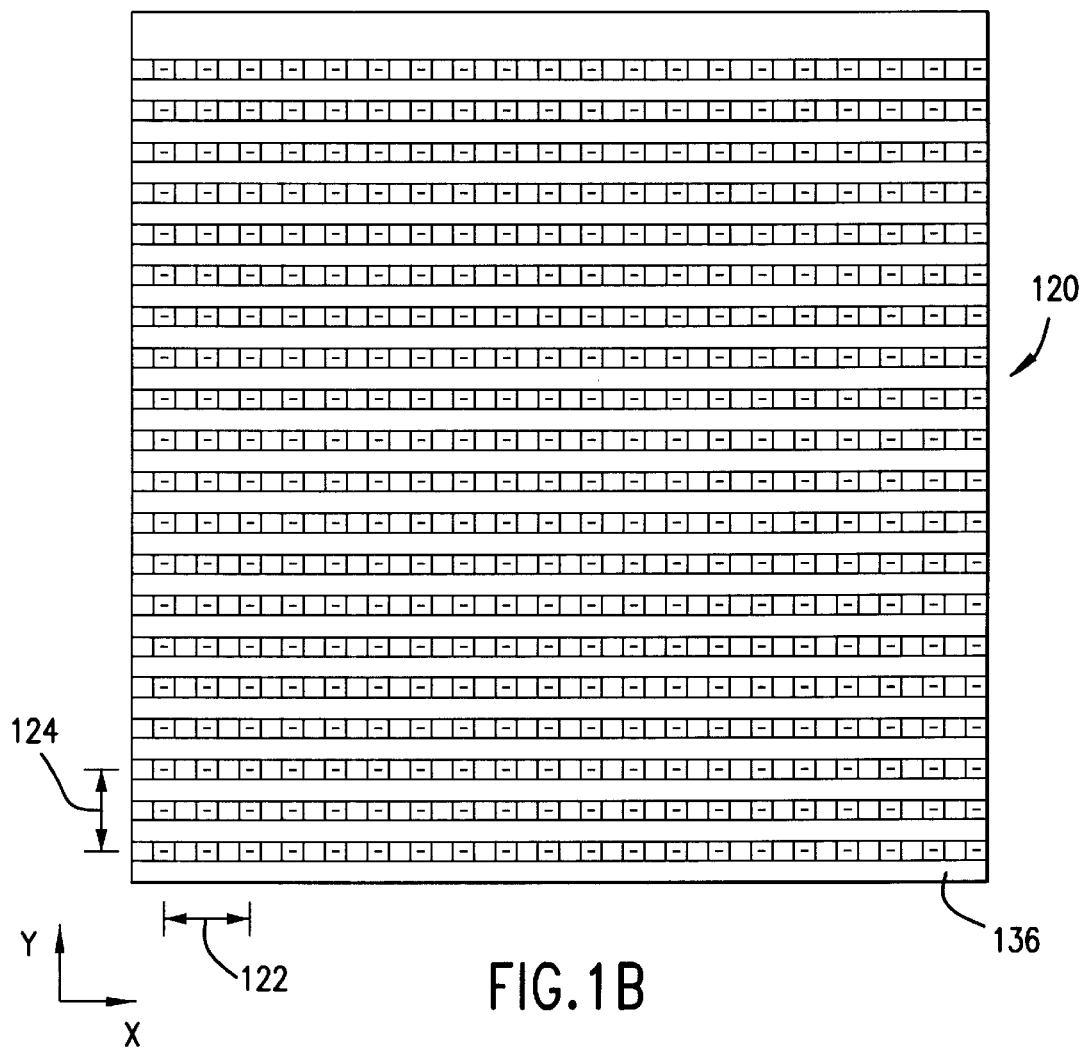
Figure 1C:
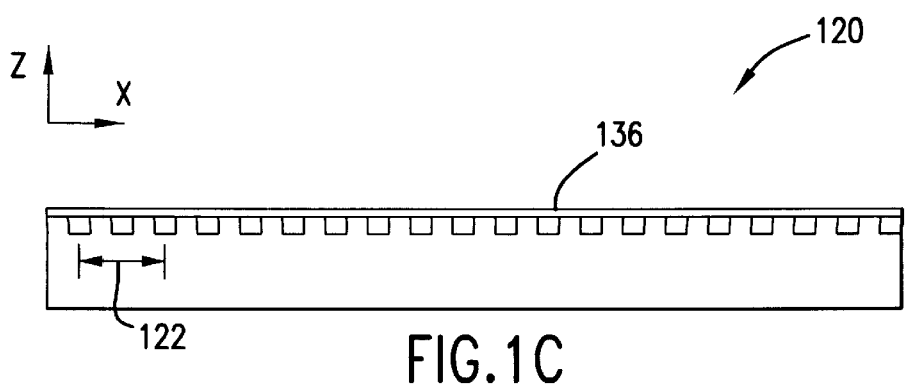

FIGS. 1A–1C illustrate components of a moving coil electric motor 100 in accordance one aspect of the present invention. FIG. 1A shows a coil array 110 attached to a platform 112. FIG. 1B shows a top view of a magnet array 120, and FIG. 1C shows a side view of the magnet array 120. During operation of the moving coil electric motor 100, a face 114 of the coil array 110 is in proximity to the top of the magnet array 120 shown in FIG. 1B.

Magnets in the magnet array 120 and coils in the coil array 110 are periodically distributed in two directions. In some embodiments, a coil period 116 in one direction approximately equals a coil period 118 in a second direction. The periods of the coil array 110 are related to periods of the magnet array 120. The first coil period 116 is a approximately three-fourths of a first magnet period 122, and the second coil period 118 is approximately three-fourths of a second magnet period 124.

A total number of coils in the coil array 110 is a multiple of 4. As will be shown below in the discussion of FIG. 3A, principles of operation for movement in an X direction and a Y direction use four adjacent, approximately identically shaped coils. To generate forces about a Z direction perpendicular to X and Y directions, the coil array 110 has at least two sets of four adjacent coils. The coil array embodiment 110 as shown in FIG. 1A has four sets of four adjacent coils.

Although all the coils are shown to have approximately the same shape, the shape may vary between different embodiments of the coil array 110. Preferably, a coil 130 covers as much of an area of one coil period in both X and Y directions as possible. A rectangular profile or outline of the coil 130 achieves this objective. Of course, when the periods 116 and 118 are approximately equal, the outline or profile preferably approximates a square.

In some embodiments, the coil 130 is wrapped about a magnetically impermeable post 132. The magnetically impermeable post 132 facilitates creating a nearly uniform magnetic field on a face of the coil 130. In contrast, a magnetically permeable post would focus a magnetic field created by the coil 130 and produce an uneven field distribution over the outline of the coil 130.

In some embodiments, a backing panel 134 is on one side of the coil array 110. The backing panel 134 may comprise a magnetically permeable material, such as iron, or a magnetically impermeable material. A magnetically permeable backing panel 134 increases the permanent magnetic flux through the coils and thus increases the performance. The magnetically permeable backing panel 134 also adds mass to the coil array 110. Therefore, a greater force must be developed by the moving coil electric motor 100 to move the coil array 110.

In some embodiments, the electric motor includes an air bearing 138 separating the coil array 110 and the magnet array 120. Construction and usage of an air bearing are known to those skilled in the art. Hinds referenced above teaches an example of an air bearing. When the air bearing separates the coil array 110 and the magnet array 120, the coil array 110 and/or the magnet array 120 may be potted with any suitable material, such as with epoxy, or covered by a flat plate made of, for example, ceramic, composite or metal, to form essentially flat surfaces. The essentially flat surfaces improve performance of the air bearing in separating or levitating the coil array 110 and magnet array 120 relative to each other. In some embodiments, the air bearing positions the coil array 110 and the magnet array 120 at a neutral position about which the coil array 110 and the magnet array 120 can move relative to each other in three degrees of freedom.

FIGS. 1B and 1C illustrate an embodiment of the magnet array 120. As noted above, the magnet array 120 has periods 122 and 124 in the X and the Y directions, respectively. The magnets alternate in polarity in both the X and the Y directions. However, along any diagonal of the X and the Y directions, the magnets are all of one polarity. The magnets in the magnet array 120 all have the same flux, but, of course, alternate in polarity. In some embodiments, a magnetically permeable backing panel 136 is attached to the magnets. The backing panel 136 completes flux paths between adjacent magnets of opposite polarities to increase the magnetic flux of each polarity.

Figure 2A:
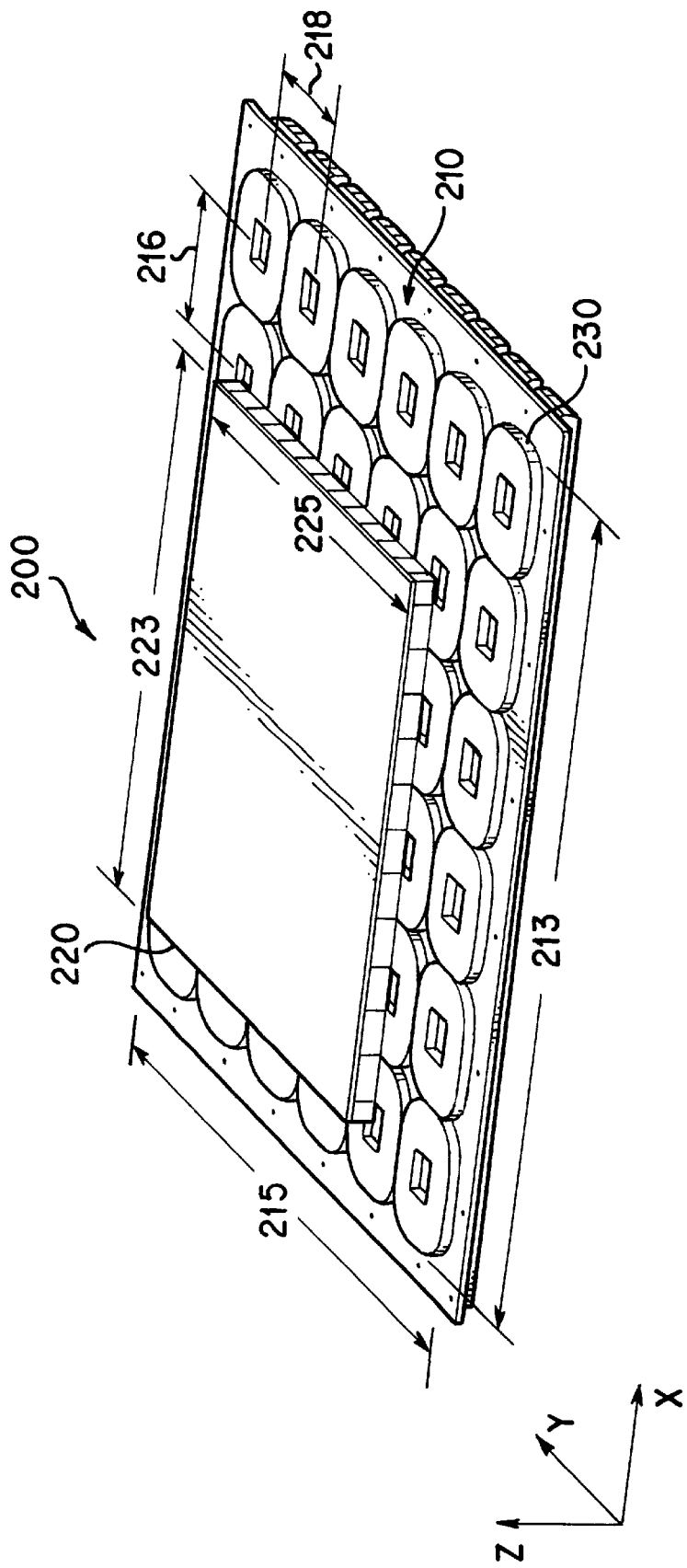
FIG. 2A illustrates a moving magnet electric motor in accordance with the present invention.

FIG. 2A illustrates a moving magnet electric motor 200 in accordance with another aspect of the present invention. The electric motor 200 has a coil array 210 and a magnet array 220. Unlike the moving coil electric motor 100 as shown in FIGS. 1A and 1B, a coil array width 213 is larger than a magnet array width 223 in an X direction, and a coil array width 215 is larger than a magnet array width 225 in a Y direction.

Apart from the overall width relationships to the magnet array 220, the coil array 210 has the same structure as the coil array 110 in the moving coil electric motor 100. The coil array 210 has a period 216 in the X direction and a period 218 in the Y direction. Each coil 230 in the coil array 210 has approximately the same shape and a rectangular coil profile is preferred.

In some moving magnet electric motor embodiments, as in the moving coil electric motor 100, an air bearing (not shown) separates the coil array 210 from the magnet array 220. When the air bearing separates the coil array 210 and the magnet array 220, the coil array 210 and/or the magnet array 220 may be potted or covered with a flat plate to form essentially flat surfaces. The same potting and cover plate materials suitable for the moving coil electric motor 100 are suitable for the electric motor 200. As in the moving coil electric motor 100, the essentially flat surfaces improve performance of the air bearing in separating or levitating the coil array 210 and magnet array 220 relative to each other. In some embodiments, the air bearing positions the coil array 210 and the magnet array 220 at a neutral position about which the coil array 210 and the magnet array 220 can move relative to each other in three degrees of freedom.

Figure 2B:
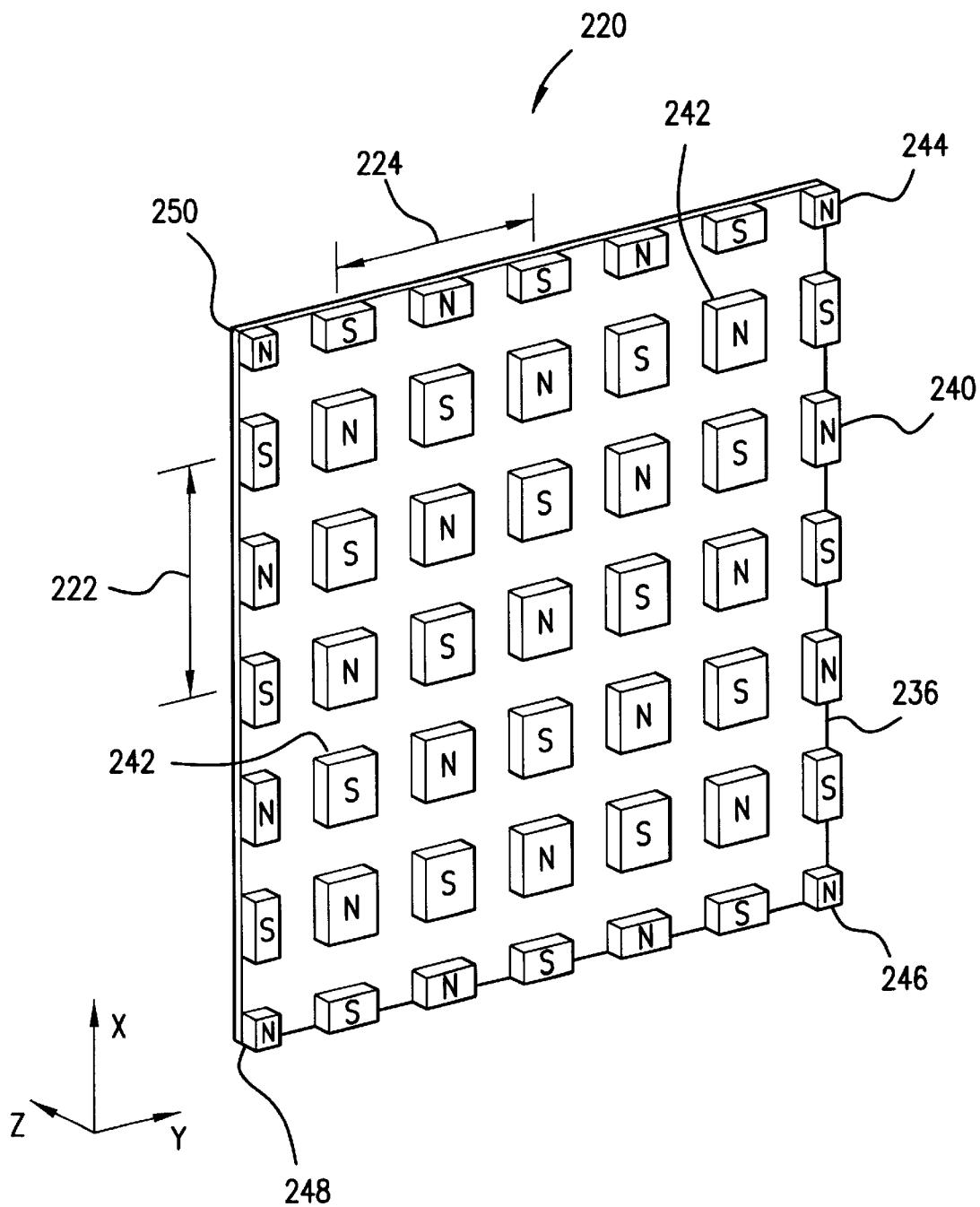
FIG. 2B illustrates a magnet array of the moving magnet electric motor in FIG. 2A.

FIG. 2B illustrates the magnet array 220 in more detail. The magnet array 220 is similar to the magnet array 120 of the moving coil electric motor 100. The magnet array 220 has a period 222 in the X direction and a period 224 in the Y direction. The magnets in the magnet array 220 alternate in polarity in both the X and the Y directions. However, diagonals of the X and the Y directions have only one polarity. The magnets are placed on a magnetically permeable backing 236.

However, unlike the magnet array 120 of the moving coil electric motor 100, magnets 240 on the edge of the magnet array 220 have fractional fluxes, such as one-quarter, one-half, or three-quarters or any other suitable fraction, compared with magnets 242 on the interior of the magnet array 220. For example, the edge magnet 240, which is not at a corner of the magnet array 220, has half a magnetic flux of the interior magnet 242. All edge magnets 240 which are not on corners in the magnet array 220 shown in FIG. 2B have half the flux of the interior magnets 242. Corner magnets 244, 246, 248 and 250 each have one-quarter the flux of the interior magnets 242. The fractional fluxes for the edge magnets 240 and corner magnets 244, 246, 248 and 250 complete flux paths with each other and with the interior magnets 242 while simultaneously minimizing fringe magnetic fields at the edges of the magnet array 220.

The fractional flux magnets are an important part of the invention. Without them, the fringe fields at the magnet array edges degrade performance of the moving magnet electric motor.

The moving magnet embodiment 200 is generally preferable to the moving coil electric motor 100 when used in positioning devices because the magnet array 220 does not require electrical current connections. Wires connected to the coil array 110 of the moving coil electric motor 100 may interfere with the motion of the coil array 110 with respect to the magnet array 120. In addition, when coil cooling is required, cooling hoses in coil array 110 may interfere with the motion of the moving coil array 110.

As in the moving coil electric motor 100, the magnet array 220 may move in six degrees of freedom with respect to the coil array 210. Each of magnet array widths 223 and 225 is larger than twice the corresponding coil periods 216 and 218 to cover four coils. This permits motion in not only the X and the Y directions, but also rotation about the Z direction perpendicular to the X and the Y directions to achieve three of the six degrees of freedom. The other three degrees of freedom are obtained by forces in the Z direction in some embodiments. The Z direction forces create relative motion of the coil array 210 and the magnet array 220 in the Z direction, about the X direction, and about the Y direction.

Figure 3A:
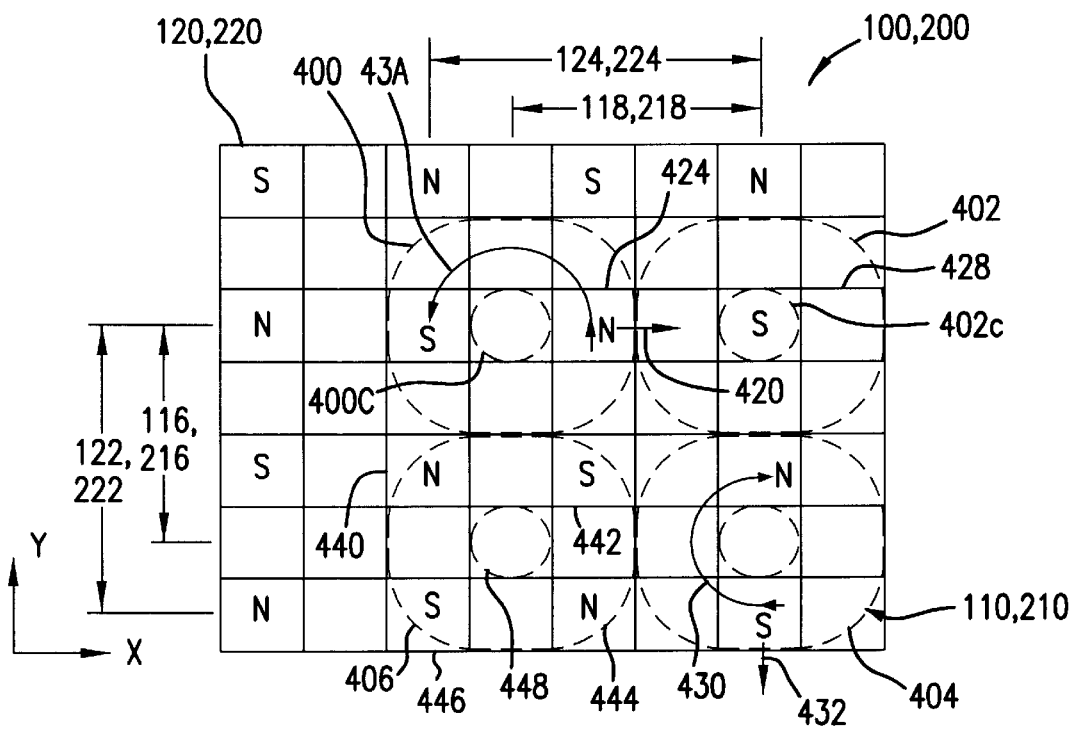
FIGS. 3A and 3B illustrate an embodiment of a process of achieving relative motion of a portion of coil array with respect to a portion of magnet array in an X direction and a Y direction in accordance with the present invention.
Figure 3B:
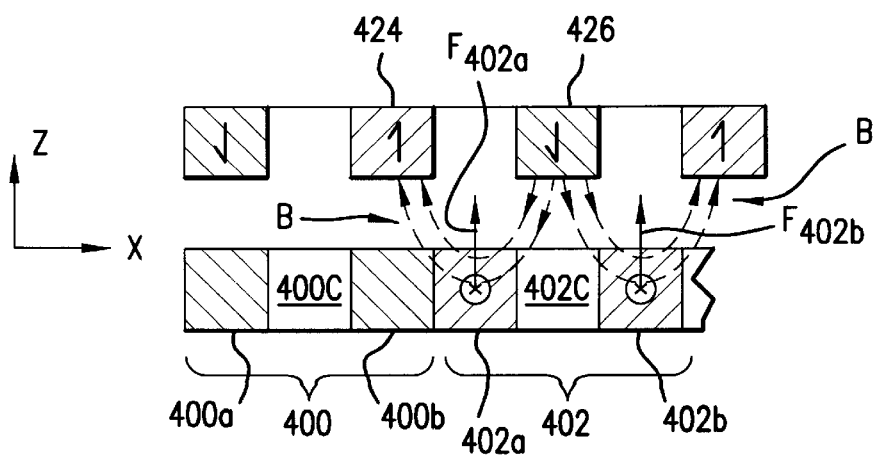

Referring now to FIGS. 3A and 3B, the interactions of currents in the coils and magnets in the magnet arrays for both the moving coil and the moving magnet electric motors 100 and 200 are described. The description of FIGS. 3A and 3B describes the motion in the X and the Y directions. FIGS. 3A and 3B also show how the embodiments 100 and 200 obtain rotational motion, such as about the Z direction. FIGS. 4A–4D describe commutation of the coils in the coil arrays 110 and 210 to obtain motion in the Z direction thereby providing degrees of freedom in the Z direction and about the X directions and Y directions.

FIG. 3A is a diagrammatic representation of a plan view of a section of either moving coil or moving magnet electric motor 100 or 200. FIG. 3B is a side cross-sectional view of a portion of the electric motor section shown in FIG. 3A. FIG. 3A shows part of the subarray of the magnetic poles 120, 220 and a set of four coils 400, 402, 404, and 406 which are part of the coil array 110, 210. In the embodiment shown in FIG. 3A, each coil has first and second periods 116 and 118 in the X and Y directions, respectively, approximately equaling ¾ of first and second magnet periods 122 and 124, respectively.

By appropriately commutating currents flowing in the coils 400, 402, 404, and 406, force is generated between the coil array 110, 210 and the magnet array 120, 220. For example, in the position shown in FIG. 3A, a counter-clockwise current 434 through coil 400 will interact with the magnetic field to exert a force on the coil array 110, 210 in a direction as indicated by arrow 420, by the right-hand rule and/or the Lorentz force laws.

In a two-phase commutation scheme in the direction 420, the coils 400 and 402 are commutated. For example, in the position shown in FIG. 3, the counter-clockwise current 434 through the coil 400 is at a maximum while the coil 402 has no current flowing through it. As the coil 400 moves in the direction 420 and its center 400c approaches the next magnetic pole 424, the counterclockwise current 434 through the coil 400 will approach zero. As the coil 400 moves in the direction 420, the coil 402 also moves in the direction 420, and its center 402c moves to location 428.

To maintain the force in the direction 420, the current in the coil 402 is commutated to flow in a counter-clockwise direction. The current in the coil 402 increases sinusoidally to its maximum. When the center 402c of coil 402 coincides with the location 428, the current in the coil 402 will be at its maximum.

Similarly, current can be commutated to flow in direction 430 about the coil 404 to exert a force on the coil array 110, 210 in a direction 432. As in the movement in the direction 420, the coils 402 and 404 may be commutated in the same fashion as the coils 400 and 402 to provide a continuous force in the direction 432. As with the coils 400 and 402, the commutation of the coils 402 and 404 is a two phase commutation.

With respect to coil 406, magnets 440, 442, 444, and 446 are symmetrically positioned about its center 406c. The magnets 440, 442, 444, and 446 create canceling forces upon the coil 406 provided the coil 406 is symmetric about its center 406c. Thus, unlike the other three coils 400, 402, and 404, the coil 406 cannot generate a force upon the coil array 110, 210 in the position shown in FIG. 3A.

Only a few examples of commutation have been described. Clearly, as will be appreciated by those skilled in the art, many other commutations may be applied to the coils 400, 402, 404, 406 and the other coils in the coil array 110, 210 to achieve force and motion in X and Y directions. By providing at least two sets of four coils and by simultaneously generating forces in both the directions 420 and 432, the electric motors 100, 200 orients the coil array 110, 210 with respect to the magnet array 120, 220 about the Z axis out of the plane of FIG. 3A.

Referring now to the cross-sectional side view of FIG. 3B showing the coils 400 and 402 of either moving coil or moving magnet electric motor, the commutation of the coils to generate a force in the Z direction will now be described. As shown, coil 402 comprises coil portions 402a and 402b about its center 402c. Similarly, coil 400 comprises coil portions 400a and 400b about its center 400c. The coil 402 experiences nonvertical components of magnetic flux density B when the magnet is at off-center locations relative to a coil portion, such as coil portions 402a, 402b. A current is applied to the coil 402 which flows through coil portion 402a in a direction into the plane of FIG. 3B and through coil portion 402b in a direction out of the plane of FIG. 3B. Nonvertical components of the magnetic flux density B interact with the current flowing through the coil portions 402a and 402b to produce forces $F_{402a}$ and $F_{402b}$, respectively, in the Z direction.

In a two-phase commutation scheme to exert force on the coil array in the Z direction relative to the magnet array, the coils 400 and 402 are commutated. For example, in the position shown in FIG. 3B, the current through the coil 402 is at a maximum while the coil 400 has no current flowing through it. When the coil 402 is moved in the X direction and its coil portion 402a approaches magnetic pole 426, the current through the coil 402 will approach zero. As the coil 402 moves in the X direction, the coil 400 also moves in the X direction and its center portion 400c moves toward a position directly below magnet pole 424.

To maintain the force in the Z direction, the current in the coil 400 is commutated which flows through coil portion 400a in a direction out of the plane of FIG. 3B and through coil portion 400b in a direction into the plane of FIG. 3B. The current applied to coil 400 will be approximately 90° out of phase relative to the current applied to coil 402. The current in the coil 400 increases sinusoidally to its maximum. When the center 400c of coil 400 is directly below magnet pole 424, the current in the coil 400 will be at its maximum.

Only a few examples of commutation have been described. Clearly, as will be appreciated by those skilled in the art, many other commutations may be applied to the coils 400, 402, 404, 406 and the other coils in the coil array 110, 210 to achieve force and motion of the coil array 110, 210 with respect to the magnet array 120, 220 in six directions: in the X, Y, Z directions and rotation about the X, Y, Z directions.

Figure 4A:
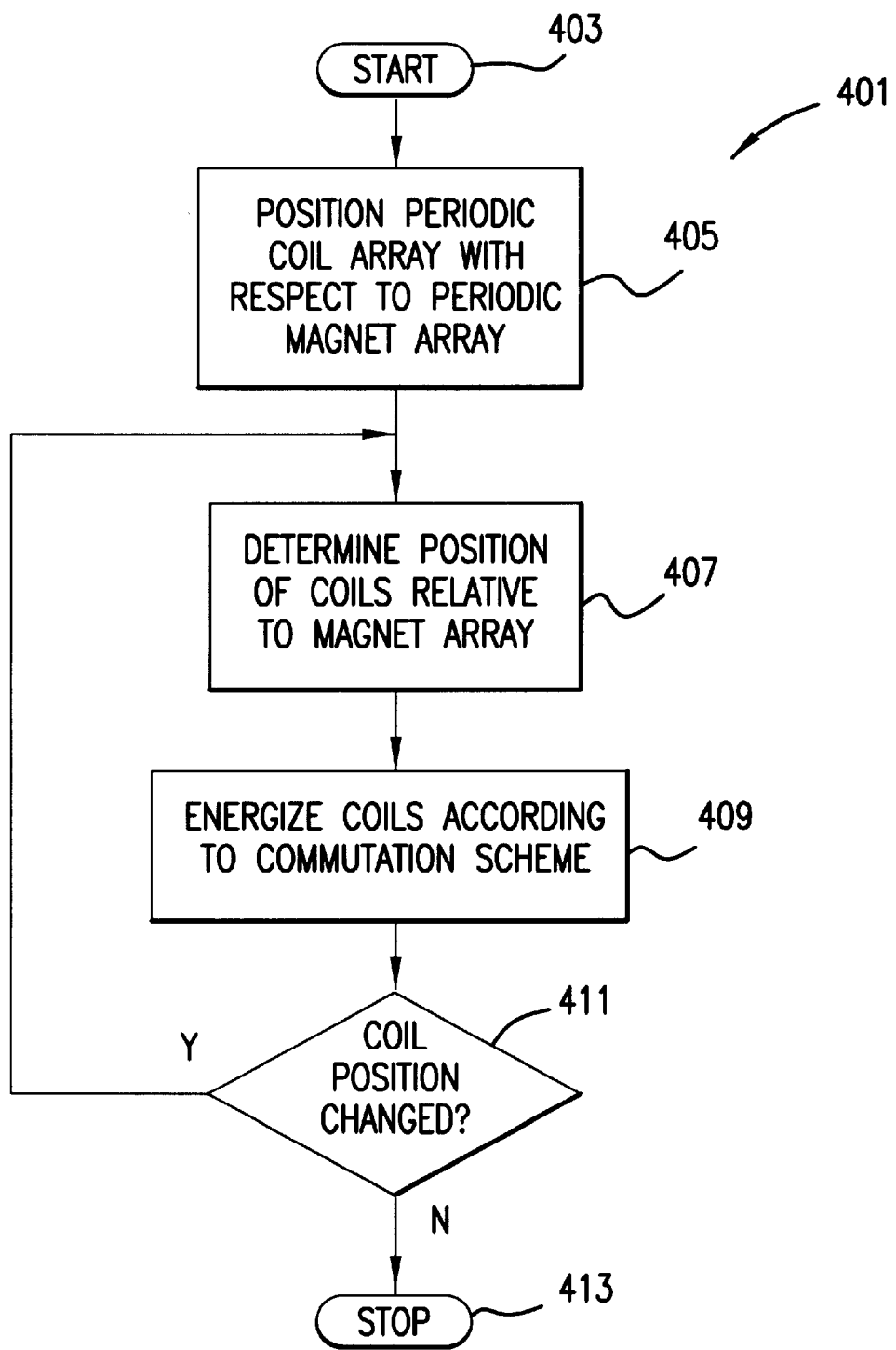
FIGS. 4A–4E illustrate embodiments of a process of achieving motion of a coil array with respect to a magnet array in accordance with the present invention.

FIGS. 4A–4E illustrate embodiments of a process or method 401 of achieving motion of the coil arrays 110 and 210 with respect to the magnet arrays 120 and 220. FIG. 4A shows a flow chart describing an embodiment of the method or process 401 beginning at a start procedure 403. Procedure 405 positions a periodic coil array, such as coil arrays 110 and 210, with respect to a periodic magnet array, such as magnet arrays 120 and 220. Procedure 407 determines the position of the coils relative to the magnet array. Procedure 409 energizes the coils according to the commutation scheme. Procedure 411 determines whether the coil position has changed. If the coil position has changed, the method 401 returns to procedure 407 to determine the position of the coils relative to the magnet array. If the coil position has not changed, the method 401 ends at a procedure 413.

Procedure 409 essentially controls a separation between a portion of the periodic coil array and a portion of the periodic magnet array by applying a current to one of the appropriate coils such that the appropriate coil interacts with a magnetic field associated with one of the magnets in the magnet array and generates Lorentz force. Multiple coils distributed in two directions in the periodic coil array are provided with appropriate currents to achieve separations between these other coils and other portions of the magnet array.

In this way, the method or process 401 achieves motion of the periodic coil array with respect to the periodic magnet array in a Z direction, separating the periodic magnet array and the periodic coil array, and further achieves rotation about the X and the Y directions. When these three degrees of freedom are combined with the three degrees of freedom illustrated in FIG. 3, the process or method 401 provides six degrees of freedom of motion of the periodic coil array with respect to the periodic magnet array.

Figure 4B:
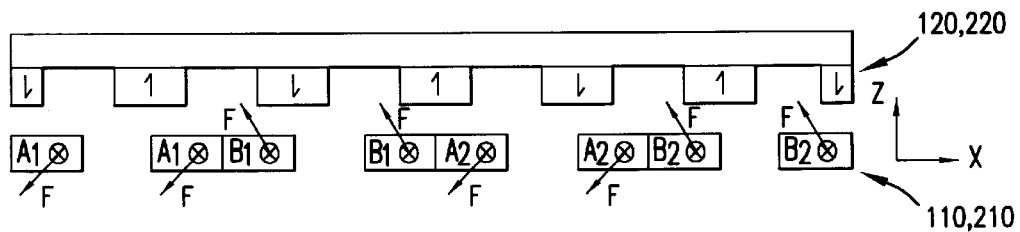
Figure 4C:
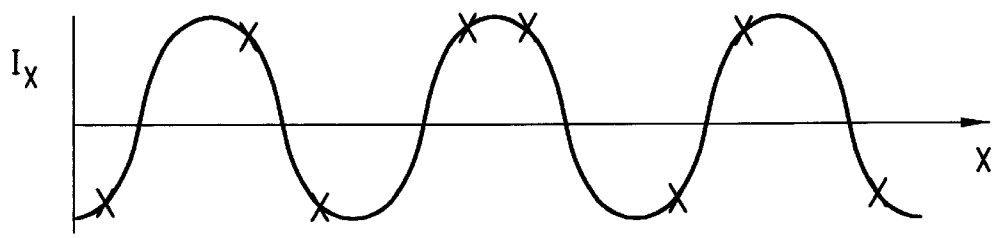
Figure 4D:
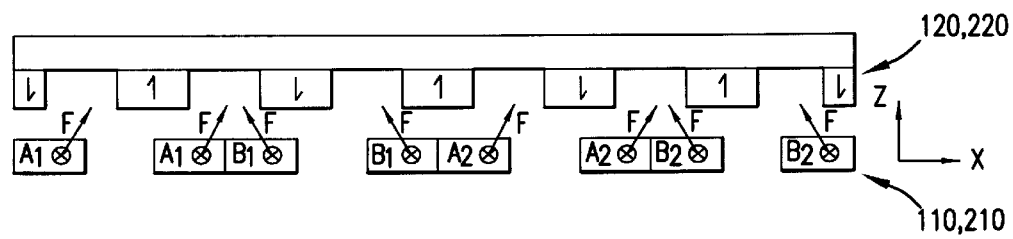

FIGS. 4B and 4D illustrate side schematic views of a two-dimensional electric motor having a periodic coil array such as coil array 110 or 210 and a periodic magnet array such as magnet array 120 or 220. As with the periodic magnet arrays described with reference to FIGS. 1B and 2B, the periodic magnet array 120, 220 alternates in polarity in the X direction. The coils in the coil array 110, 210 are grouped into two phases, A-phase coils and B-phase coils. FIGS. 4B and 4D shows two A-phase coils, A1 and A2, and two B-phase coils, B1 and B2. The two B-phase coils and the two A-phase coils in the section of the electric motor illustrated in FIGS. 4B and 4D are positioned such that the B1 coil is between the A1 and A2 coils and the A-2 coil is between the B1 and B2 coils.

FIG. 4C shows a periodic wave-like current distribution $I_x$ applied to a coil, such as coil A1, as a function of the position of the coil along the X direction. The current distribution $I_x$ is applied to achieve forces and motion of the coil relative to the magnet array 120, 220 in the X direction. FIG. 4B illustrates the direction of the current flow through the coils A1, A2 and B1 and B2 as well as the resultant forces F exerted between the coils and the magnet array as a result of the interaction between the current and the magnetic field. Note that although the generated forces F contain Z direction components, these Z direction force components cancel out within the array of coils such that the forces and motions of the coils relative to the magnet array in the X direction are independent of those in the Z direction.

Positive and negative current inputs, as indicated by "x" on the $I_x$-X current distribution graph, are part of an electrical current distribution in the X direction on the A1 and A2 coils. By the right-hand rule and/or the Lorentz force laws as described with reference to FIG. 3B, the current inputs generate forces between the A1 and A2 coils and the magnet array in the X direction. Alternatively, a periodic distribution such as a sine, triangle or square wave can also generate forces between the coils A1 and A2 and the magnet array and hence generate a force between the coil array and the magnet array in the X direction. Additionally, the sine wave shows a way of modulating the applied current signal in time as the coil A1 moves in the X direction to maintain a constant force in the X direction. Of course, in that case the sine wave represents a position-varying current applied to the coil A1 that results in a time varying current.

Figure 4E:
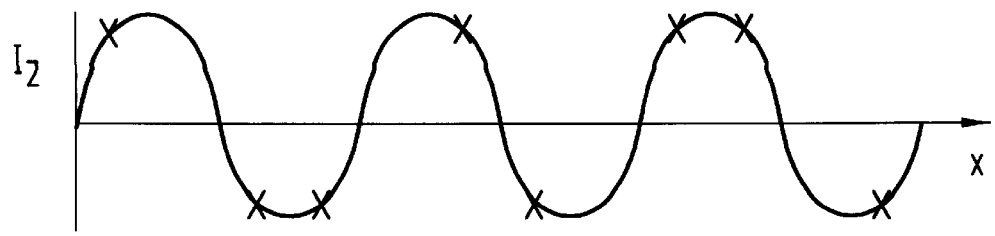

FIG. 4E shows a periodic wave-like current distribution $I_z$ applied to a coil, such as coil A1, as a function of the position of the coil along the Z direction. The current distribution $I_z$ is applied to the coil to achieve forces and motion of the coil relative to the magnet array 120, 220 the periodic coil array 110, 210 in the Z direction. FIG. 4D illustrates the direction of the current flow through the coils A1, A2 and B1 and B2 as well as the result forces F exerted between the coils and the magnet array as a result of the interaction between the current and the magnetic field. Note that although the generated forces F contain X direction components, these X direction force components cancel out within the array of coils such that the forces and motions of the coils relative to the magnet array in the Z direction are independent of those in the X direction.

Positive and negative current inputs applied to the B1 and B2 coils produce separating forces in the Z direction between the periodic magnet array 120, 220 and the periodic coil array 110, 210 by the right-hand rule and/or the Lorentz force law, as described with reference to FIG. 3B. As shown in FIG. 4E, a sine wave current distribution as a function of the X direction having a crest corresponding with the positive current input and a trough corresponding with the negative current input can also be used to generate separating Z forces. However, the sine wave of FIG. 4E is 90° out of phase with respect to the sine wave distribution of FIG. 4C.

The method or process 401 outlined in FIGS. 4A–4E provides six degrees of freedom of motion between the magnet array 120, 220 and the coil array 110, 210. Clearly, other portions in addition to the portion illustrated in FIGS. 4B and 4D may be similarly commutated by currents and current distributions as illustrated in FIG. 4C and 4E to produce differing magnitudes of X and Z forces on various portions of the electric motor. Since these various portions are separated by distances in the X direction and/or Y direction, rotational force about the Z direction and Y direction and linear force in the X direction can be produced. An identical analysis of forces acting upon coils distributed in the Y direction as in FIGS. 4B–4E implies rotational force about the X direction and Z direction and linear force in the Y direction can be achieved. Thus, the invention process or method 401 provides six degrees of freedom of motion for the electric motor having a periodic coil array and a periodic magnet array.

The electric motors 100 and 200 commutated by currents such as those illustrated in FIGS. 4C and 4D may be included in positioning devices. FIGS. 5, 6A–6B, and 7A–7B diagrammatically illustrate positioning devices incorporating motors of the present invention.

Figure 5:
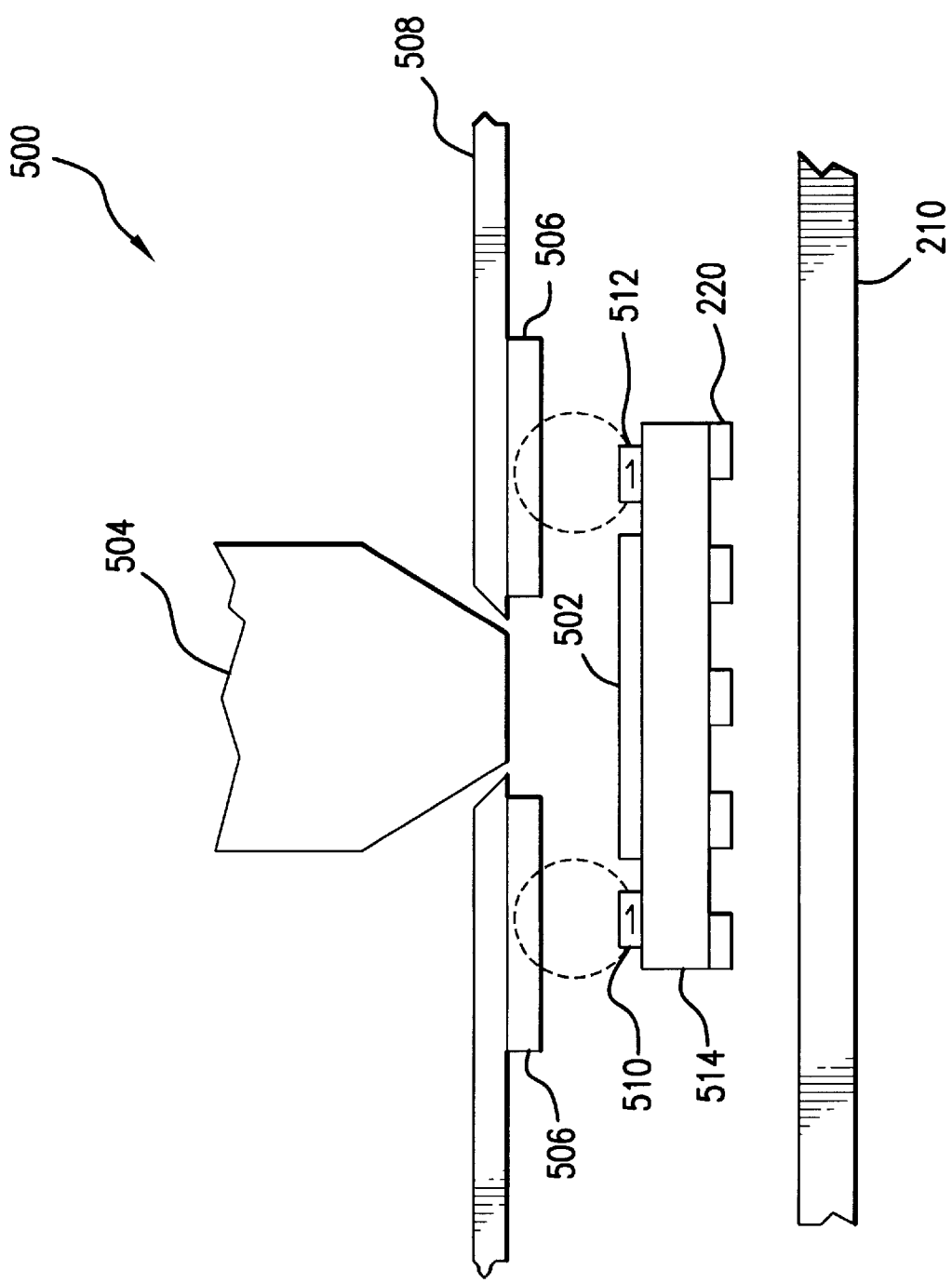
FIG. 5 diagrammatically illustrates a side cross-section of a positioning device utilizing an embodiment of the electric motor illustrated in FIG. 2A.

FIG. 5 diagrammatically illustrates a side cross-section of a positioning device 500 utilizing an embodiment of the motor 200 illustrated in FIG. 2A. In the particular environment shown in FIG. 5, the positioning device 500 positions a wafer 502 in relation to a photolithography lens 504. This arrangement typically occurs in semiconductor processing of the wafer 502. The positioning device 500 has a frame 506 made of a magnetically permeable material such as iron. The frame is attached to a body 508 in some embodiments.

A support member 514 supports the wafer 502 and is attached to various magnets. The support member 514 may be any suitable device for supporting the wafer 502. For example, the support member 514 may include a vacuum chuck or an electrostatic wafer chuck. Levitation or support magnets 510 and 512 on a same side of the support member 514 as the wafer 502 are magnetically attracted to portions of the frame 506. The periodic magnet array 220 of the electric motor 200 may be attached to the support member 514 on a side opposite the side supporting the wafer 502.

The support member 514 and hence the wafer 502 are positionable in three or six degrees of freedom. The magnetic flux of the levitation magnets 510 and 512 can be appropriately chosen to produce an attractive force between the levitation magnets 510 and 512 and the frame 506 to offset a combined weight of the levitation magnets 510 and 512, the wafer 502, the support member 514, and the periodic magnet array 220. Where a magnetic backing plate (not shown) is provided on one side of the coil array, the attractive force of the levitation magnets 510 and 512 may be necessary to counter the force between the magnetic coil array backing plate and the magnet array 220. The interaction of the levitation magnets 510 and 512 with the magnetically permeable material in the frame 506 suspends or levitates the support member 514 motionless in a neutral position. Therefore, the interaction of the levitation magnets 510 and 512 with the frame 506 replaces an air bearing levitation of the support member 514. The process or method 401 described with reference to FIGS. 4A–4C commutates coils in the periodic coil array 210 to position the support member in six degrees of freedom via interaction of the periodic coil array 210 with the periodic magnet array 220.

The support member 514 may be made from a variety of materials. In particular, the support member may be made of a magnetically impermeable material such as a ceramic material. A magnetically impermeable material will generally be lighter and require less force to support than an a magnetically permeable material. In addition, magnetically impermeable materials do not interfere with the magnetic interactions suspending and moving the support member 514. Alternatively, the support member 514 may be made from a combination of a magnetically impermeable material and a magnetically permeable material such as iron and ceramic.

Figure 6A:
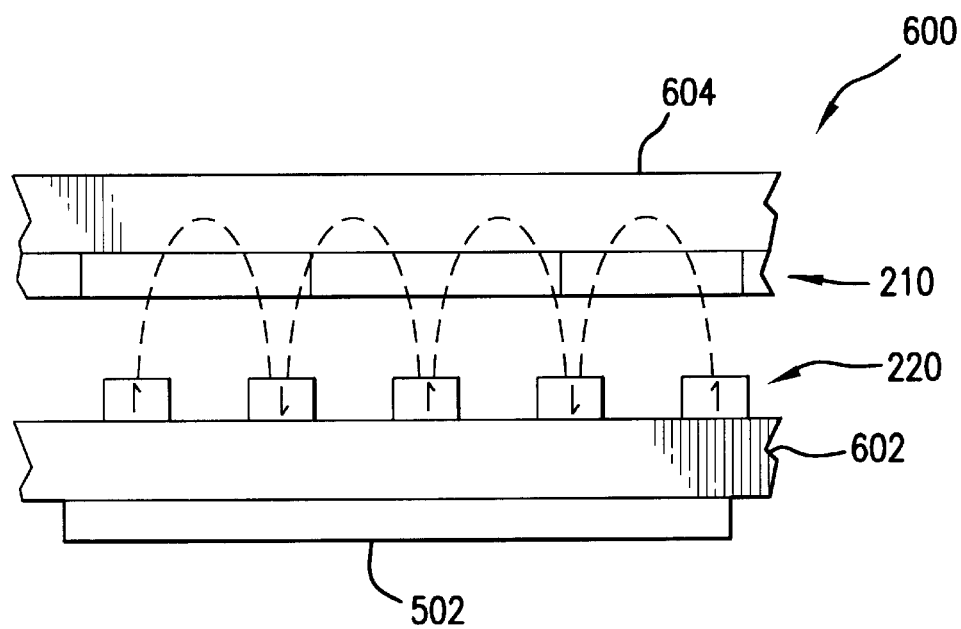
FIGS. 6A and 6B diagrammatically illustrate side cross-sections of embodiments of positioning devices utilizing electric motors and suspended support members.
Figure 6B:
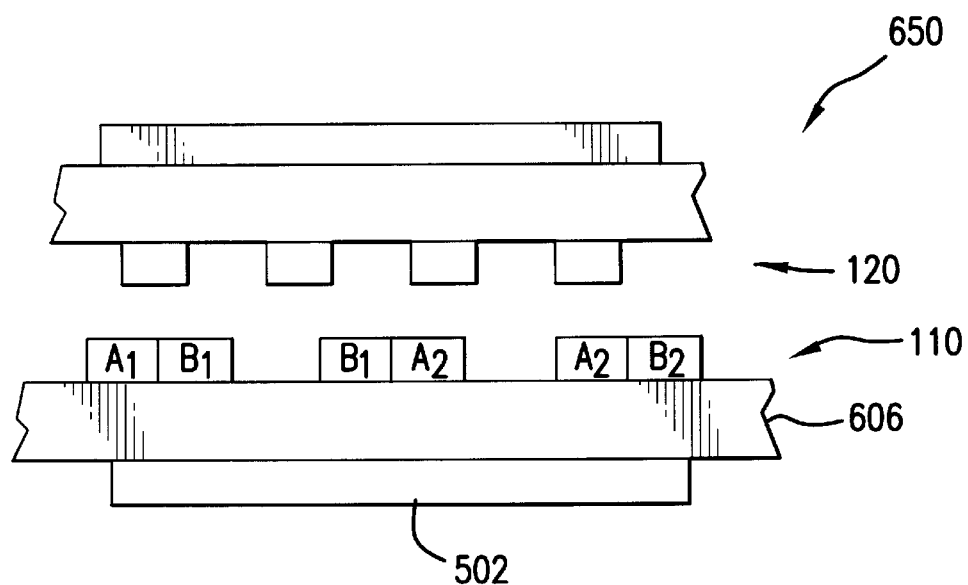

FIGS. 6A and 6B diagrammatically illustrate embodiments of positioning devices 600 and 650 utilizing electric motors to suspend support members. In FIG. 6A, the positioning device 600 is a moving magnet electric motor having the magnet array 220 attached to the support member 602. The positioning device 600 has a wafer 502 beneath a support member 602. The magnet array 220 is on top of the support member 602 on a side of the support member 602 opposite a side contacting the wafer 502. The magnet array 220 interacts with the coil array 210 to provide motion in three or six degrees of freedom depending upon the commutation. The method 401 described above with respect to FIGS. 4A–4E are directly applicable to the positioning device 600 to position the support member and hence the wafer 502 in six degrees of freedom with respect to the coil array 210. In some embodiments of the positioning device 600, the coil array 210 will have a magnetically permeable backing 604 interacting with magnets in the magnet array 220 to suspend the support member 602 in a neutral position.

The positioning device 650 illustrated in FIG. 6B utilizes the moving coil electric motor. The coil array 110 is attached to a support member 606. The wafer 502 is on one side of the support member 606 and the coil array 110 is on the opposite side of the support member 606. The magnet array 120 is positioned near the coil array 110. By appropriate commutation of the coils in the coil array 110, the support member 606 and hence the wafer 502 may move with respect to the magnet array 120 in either three or six degrees of freedom.

Figure 7A:
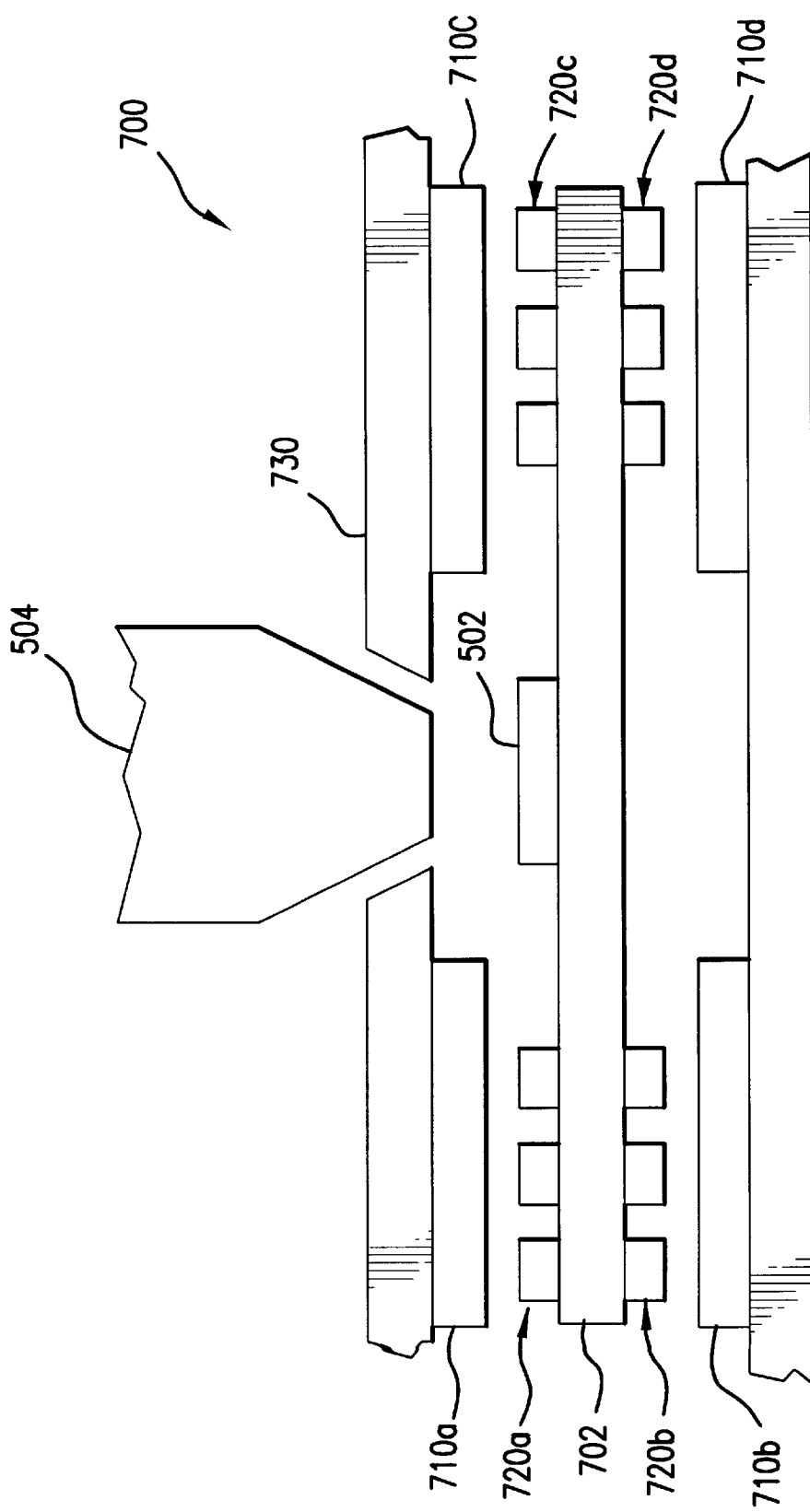
FIGS. 7A and 7B diagrammatically illustrate side cross-sections of embodiments of positioning devices.

FIG. 7A diagrammatically illustrates side cross-section of a winged embodiment 700 of positioning device 600. Magnet arrays 720a, 720b, 720c, and 720d are attached to a support member 702. The support member 702 supports the wafer 502 on one side of the support member 702. The magnet arrays 720a and 720c are attached to the same side of the support member 702 and the magnet arrays 720b and 720d are attached to an opposite side of the support member 702. The magnet arrays interact with corresponding coil arrays 710a, 710b, 710c, 710d to provide motion in three or six degrees of freedom depending upon the commutation of the coils in the coil arrays 710a, 710b, 710c, 710d. As depicted, the coil array 710a is above the magnet array 720a, and the coil array 710c is above the magnet array 720c. The coil arrays 710a and 710c are attached to a magnetically permeable backing 730 in some embodiments. In addition, the coil array 710b is beneath the magnet array 720b and the coil array 710d is beneath the magnet array 720d. The coil arrays 710b and 710d are attached to a backing 740. Backing 740 may be made of a magnetically impermeable material.

Figure 7B:
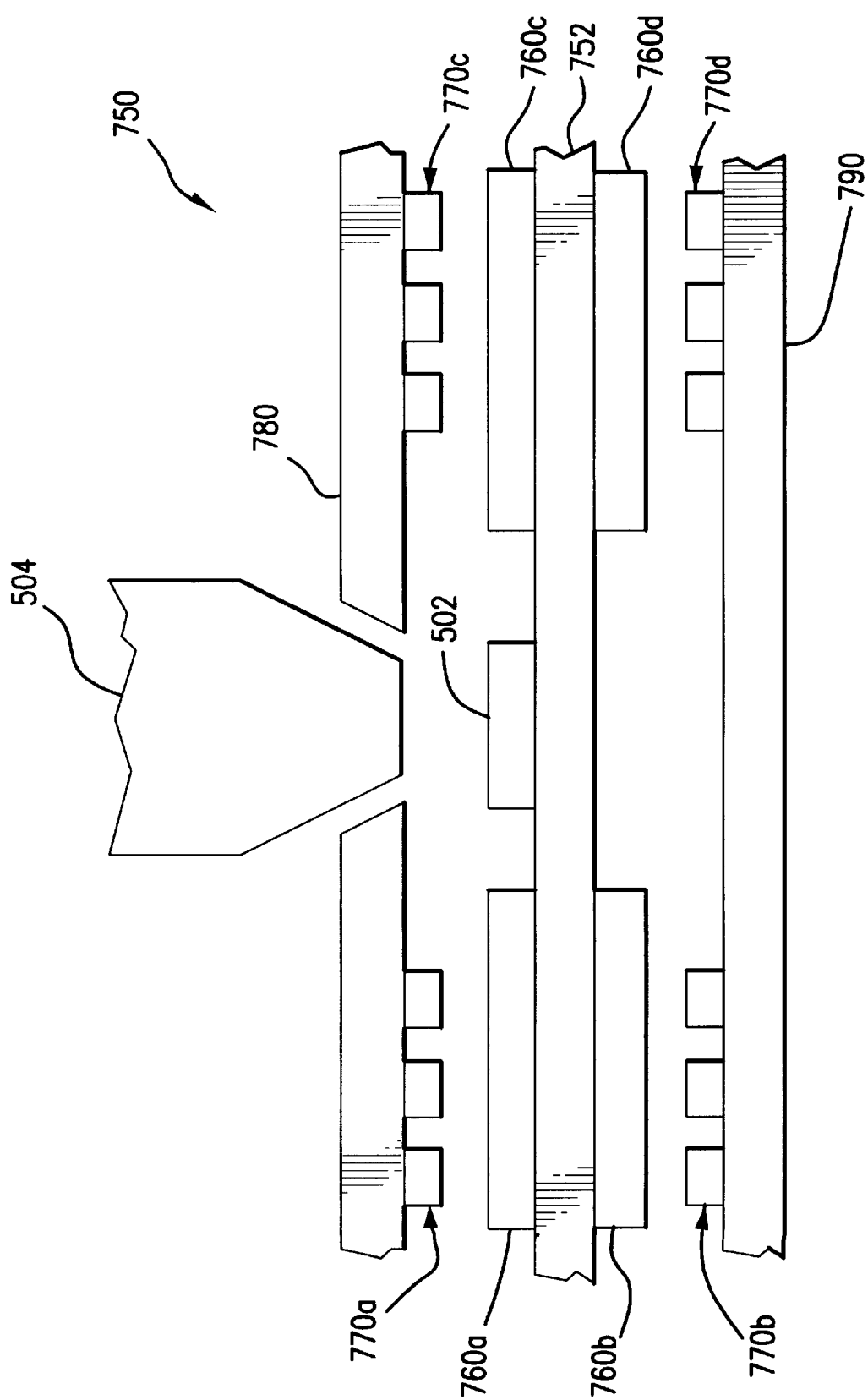

FIG. 7B diagrammatically illustrates side cross-sections of winged embodiments 750 of positioning device 650. Coil arrays 760a, 760b, 760c, and 760d are attached to a support member 752. The support member 752 supports the wafer 502 on one side of the support member 752. The coil arrays 760a and 760c are attached to the same side of the support member 752 and the coil arrays 760b and 760d are attached to an opposite side of the support member 752. The coil arrays interact with corresponding magnet arrays 770a, 770b, 770c, 770d to provide motion in three or six degrees of freedom depending upon the commutation of the magnets in the magnet arrays 770a, 770b, 770c, 770d. As depicted, magnet coil array 770a is above the coil array 760a, and the magnet array 710c is above the coil array 760c. The magnet arrays 770a and 770c are attached to a magnetically permeable backing 780 in some embodiments. In addition, the magnet array 770b is beneath the coil array 760b and the magnet array 770d is beneath the coil array 760d. The magnet arrays 770b and 770d are attached to a backing 790. Backing 790 may be made of a magnetically impermeable material.

In either of the winged embodiments 700, 750 shown in FIGS. 7A and 7B, the embodiments 700, 750 may be utilized to adjust the distance between the support member 702, 752 and the backing 730, 780 and between support member 702, 752 and the backing 740, 790 such a static balance equilibrium may be achieved, given the mass of the moving array portion 720, 760 of the respective embodiments. Thus, the provision of support or levitation magnets may not be necessary in such embodiments.

Figure 8:
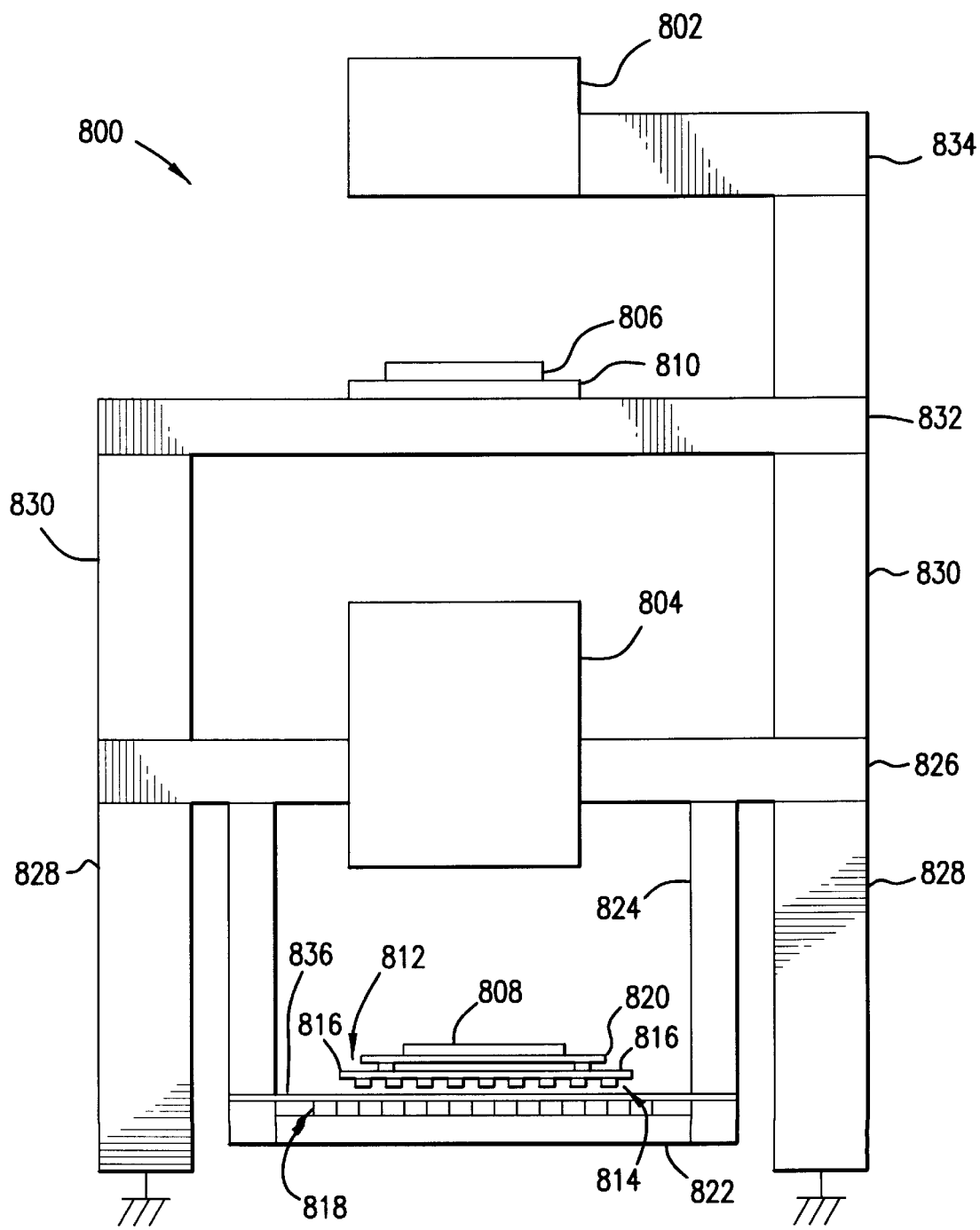
FIG. 8 shows a side view of an example of a photolithography system using the electric motor of the present invention.

The electric motors of the present invention may be used with a lithography system such as shown and described in, for example, U.S. Pat. No. 5,528,118, "Guideless Stage With Isolated Reaction Stage," issued to Lee on Jun. 18, 1996, referenced in the Background section, which is incorporated herein by reference in its entirety. FIG. 8 shows a side view of an example of a photolithography system 800 using the electric motor 200 of the present invention. Although the photolithography system 800 is described as utilizing a moving magnet electric motor 812, the photolithography system may be adapted to utilize a moving coil electric motor or other variations of the moving magnet electric motor.

The lithography system 800 generally comprises an illumination system 802 and a moving magnet electric motor 812 for wafer support and positioning. The illumination system 802 projects light through a reticle 806 which is supported by and scanned using stage 810. The pattern on the reticle 806 is generally a circuit pattern for a semiconductor device. The reticle stage is supported by a frame 832. The light is focused through a lens 804 supported on a body 826 which is in turn connected to the ground through a support 828. The lens 804 is also connected to the illumination system 802 through frames 830, 832, and 834. The light exposes a layer of photoresist on a substrate such as a wafer 808.

The wafer 808 is supported by and scanned using a stage 820 which is in turn supported and positioned by the moving magnet electric motor 812. The electric motor 812 comprises a moving magnet array 814 and a fixed coil array 818. The wafer stage 820 is supported by air bearings 816 on a plate 836. The wafer stage system, including the backing plate 822, is connected to the body 826 through the frame 824. It is to be understood that the photolithography system may be different than the one shown herein without departing from the scope of the invention.

Although only a few exemplary embodiments of this invention have been described in detail above, those skilled in the art will readily appreciate that many modifications are possible in the exemplary embodiments without materially departing from the novel teachings and advantages of this invention. For example, although depicted as being planar, the arrays of magnetic poles and coils can have either constant or varying curvature in one or two-dimensions as in cylindrical, toroidal, and spherical arrangements of magnetic poles and coils. For cylindrical arrangements, latitudinal and longitudinal directions may be defined, for example, in standard cylindrical coordinates with corresponding diagonal directions, and parallel arrays and coils lie on parallel surfaces. Accordingly, all such modifications are intended to be within the scope of the following claims.

What is claimed is:

1. An electric motor, comprising:
    a planar magnet array having magnets with magnetic fields, the magnets being disposed in a plane; and
    a planar coil array positioned adjacent to the magnet array and operable to interact with the magnetic fields to provide a force between the coil array and the magnet array in a first, second and third direction, the first and second directions being generally parallel to the plane and the third direction being generally orthogonal to the plane;
    wherein the coil array has a first coil period in the first direction and a second coil period in the second direction and wherein the magnet array has a first magnet period in the first direction and a second magnet period in the second direction, the first coil period being less than the first magnet period and the second coil period being less than the second magnet period.

2. The electric motor of claim 1, wherein said magnet array and said coil array interact to further provide a torque between the coil array and the magnet array about the third direction.

3. The electric motor of claim 1, wherein said magnet array and said coil array interact to further provide a torque between the coil array and the magnet array about the first and second directions.

4. The electric motor of claim 1, further comprising a bearing attached to at least one of said magnet array and said coil array, said bearing supporting said magnet array relative to said coil array.

5. The electric motor of claim 1, wherein the coil array has a first dimension in the first direction and a second dimension in the second direction and wherein the magnet array has a first dimension in the first direction and a second dimension in the second direction, the first coil dimension being larger than the first magnet dimension and the second coil dimension being larger than the second magnet dimension.

6. The electric motor of claim 1, wherein the magnet array includes edge magnets disposed on a periphery of the magnet array and interior magnets disposed interior of the edge magnets, each edge magnet having a magnetic flux less than a magnetic flux of each interior magnet.

7. The electric motor of claim 6, wherein the magnet array has at least one corner and wherein the edge magnets include a corner magnet at each corner of the magnet array, the corner magnets having a magnetic flux less the magnetic flux of other edge magnets.

8. An electric motor, comprising:
    a planar magnet array having magnets with magnetic fields, the magnets being disposed in a plane; and
    a planar coil array positioned adjacent to the magnet array and operable to interact with the magnetic fields to provide a force between the coil array and the magnet array in a first, second and third direction, the first and second directions being generally parallel to the plane and the third direction being generally orthogonal to the plane, wherein the magnet array includes edge magnets disposed on a periphery of the magnet array and interior magnets disposed interior of the edge magnets, each edge magnet having a magnetic flux less than a magnetic flux of each interior magnet.

9. The electric motor of claim 8, wherein the magnet array has at least one corner and wherein the edge magnets include a corner magnet at each corner of the magnet array, the corner magnets having a magnetic flux less the magnetic flux of other edge magnets.

10. A positioning device comprising:
    a frame having a first surface;
    a support having a first surface;
    a magnet array having magnets with magnetic fields disposed in a plane on the first surface of one of the frame and support;
    a coil array disposed on the first surface of the other of the frame and support, the coil array being positioned adjacent to the magnet array and operable to interact with the magnetic fields to provide a force between the coil array and the magnet array in a first, second and third direction, the first and second directions being generally parallel to the plane and the third direction being generally orthogonal to the plane; and at least one air bearing attached to at least one of said frame and support, said bearing movably supporting said magnet array and said coil array relative to each other generally in the third direction.

11. A positioning device comprising:

a frame having a first surface;

a support having a first surface;

a magnet array having magnets with magnetic fields disposed in a plane on the first surface of one of the frame and support; and a coil array disposed on the first surface of the other of the frame and support, the coil array being positioned adjacent to the magnet array and operable to interact with the magnetic fields to provide a force between the coil array and the magnet array in a first, second and third direction, the first and second directions being generally parallel to the plane and the third direction being generally orthogonal to the plane; wherein said frame and support are magnetically supported relative to each other, and wherein one of the frame and support includes at least one support magnet and at least a portion of the other of the frame and support comprises a magnetically permeable material, the support magnet and the magnetically permeable material interact to support the magnet array relative to the coil array.

12. The positioning device of claim 11, wherein the support is adapted to support a wafer, the support being magnetically suspended from the frame.

13. The positioning device of claim 12, wherein the support has a second surface opposing the first surface, the second surface of the support being adapted to support the wafer, wherein the magnet array is disposed on the first surface of the support.

14. The positioning device of claim 12, wherein the support has a second surface opposing the first surface, the second surface of the support being adapted to support the wafer, wherein the coil array is disposed on the first surface of the support.

15. The positioning device of claim 11, wherein each of the frame and the support has a second surface, further comprising:

a second magnet array having second magnets with second magnetic fields disposed in a plane on one of the second frame surface and the second support surface; and a second coil array disposed on a plane on the other of the second frame surface and the second support surface, the second coil array being positioned adjacent to the second magnet array and operable to interact with the second magnetic fields to provide a second force between the second coil array and the second magnet array in the first, second and third directions.

16. The positioning device of claim 15, wherein the force provided by the coil array and the magnet array and the second force provided by the second coil array and the second magnet array combine to position the support relative to the frame.

17. The positioning device of claim 15, wherein the magnet arrays are disposed on the first and second surfaces of the support.

18. The positioning device of claim 15, wherein the coil arrays are disposed on the first and second surfaces of the support.

19. The positioning device of claim 15, wherein the magnet arrays are disposed on one of the surfaces of the support and one of the surfaces of the frame.

20. The positioning device of claim 15, wherein the second magnet array is disposed on the second frame surface and the second coil array is disposed on the second support surface.

21. A positioning device comprising:

a frame having a first surface;

a support having a first surface;

a magnet array having magnets with magnetic fields disposed in a plane on the first surface of one of the frame and support; and a coil array disposed on the first surface of the other of the frame and support, the coil array being positioned adjacent to the magnet array and operable to interact with the magnetic fields to provide a force between the coil array and the magnet array in a first, second and third direction, the first and second directions being generally parallel to the plane and the third direction being generally orthogonal to the plane; wherein said frame and support are magnetically supported relative to each other, said support is magnetically suspended from said frame, said support has a second surface opposing the first surface, said second surface of said support being adapted to support a wafer, and wherein said coil array is disposed on said first surface of said support.

22. A positioning device comprising:

a frame having first and second surfaces;

a support having first and second surfaces;

a first magnet array having first magnets with first magnetic fields disposed in a plane on the first surface of the frame;

a first coil array disposed on the first surface of the support, the first coil array being positioned adjacent to the first magnet array and operable to interact with the first magnetic fields to provide a force between the first coil array and the first magnet array in a first, second and third direction, the first and second directions being generally parallel to the plane and the third direction being generally orthogonal to the plane;

a second magnet array having second magnets with second magnetic fields disposed in a plane on the second frame surface; and a second coil array disposed on a plane on the second support surface, the second coil array being positioned adjacent to the second magnet array and operable to interact with the second magnetic fields to provide a second force between the second coil array and the second magnet array in the first, second and third directions.

23. A positioning device comprising:

a frame having first and second surfaces;

a support having first and second surfaces;

a first magnet array having first magnets with first magnetic fields disposed in a plane on the first surface of one of the frame and support;

a first coil array disposed on the first surface of the other of the frame and support, the first coil array being positioned adjacent to the first magnet array and operable to interact with the first magnetic fields to provide a force between the first coil array and the first magnet array in a first, second and third direction, the first and second directions being generally parallel to the plane and the third direction being generally orthogonal to the plane;

a second magnet array having second magnets with second magnetic fields disposed in a plane on one of the second frame surface and the second support surface; and a second coil array disposed on a plane on the other of the second frame surface and the second support surface, the second coil array being positioned adjacent to the second magnet array and operable to interact with the second magnetic fields to provide a second force between the second coil array and the second magnet array in the first, second and third directions; wherein the magnet arrays are disposed on one of the surfaces of the support and one of the surfaces of the frame.

24. A positioning device comprising:

a frame having first and second surfaces;

a support having first and second surfaces;

a first magnet array having first magnets with first magnetic fields disposed in a plane on the first surface of one of the frame and support;

a first coil array disposed on the first surface of the other of the frame and support, the first coil array being positioned adjacent to the first magnet array and operable to interact with the first magnetic fields to provide a force between the first coil array and the first magnet array in a first, second and third direction, the first and second directions being generally parallel to the plane and the third direction being generally orthogonal to the plane;

a second magnet array having second magnets with second magnetic fields disposed in a plane on the second frame surface; and a second coil array disposed on a plane on the second support surface, the second coil array being positioned adjacent to the second magnet array and operable to interact with the second magnetic fields to provide a second force between the second coil array and the second magnet array in the first, second and third directions.

25. An exposure apparatus, comprising:

an optical system for imaging a pattern onto an article, the optical system comprising a frame;

a stage device for positioning of the article relative to the optical system for imaging, comprising:

a stage movable relative to the optical system and having a first surface and a second surface, the second surface being adapted for supporting the article;

a magnet array having magnets with magnetic fields, the magnets being disposed in a plane; and a planar coil array positioned adjacent to the magnet array and operable to interact with the magnetic fields to provide a force between the coil array and the magnet array in a first, second and third direction, the first and second directions being generally parallel to the plane and the third direction being generally orthogonal to the plane, one of the magnet array and the coil array being attached to the frame and the other of the magnet array and the coil array being attached to the first surface of the stage, wherein the stage is magnetically supported relative to the optical system, and wherein one of the frame and stage includes at least one support magnet and the other of the frame and stage comprises a magnetically permeable material, the support magnet and the magnetically permeable material interact to support the magnet array relative to the coil array.

26. The exposure apparatus of claim 25, wherein the magnet array is movable relative to the coil array in six degrees of freedom.

27. The exposure apparatus of claim 25, wherein the stage is magnetically suspended from the frame.

28. The exposure apparatus of claim 27, wherein the coil array is disposed on the first surface of the stage.

29. The exposure apparatus of claim 27, wherein the magnet array is disposed on the first surface of the stage.

30. The exposure apparatus of claim 29, wherein the frame comprises a magnetically permeable material such that the magnet array and the frame interact to suspend the stage and the magnet array relative to the frame.

31. An exposure apparatus, comprising:

an optical system for imaging a pattern onto an article, the optical system comprising a frame;

a stage device for positioning of the article relative to the optical system for imaging, comprising:

a stage movable relative to the optical system and having a first surface and a second surface, the second surface being adapted for supporting the article;

a magnet array having magnets with magnetic fields, the magnets being disposed in a plane; and a planar coil array positioned adjacent to the magnet array and operable to interact with the magnetic fields to provide a force between the coil array and the magnet array in a first, second and third direction, the first and second directions being generally parallel to the plane and the third direction being generally orthogonal to the plane, one of the magnet array and the coil array being attached to the frame and the other of the magnet array and the coil array being attached to the first surface of the stage, wherein the stage is magnetically supported relative to the optical system, the stage is magnetically suspended from the frame, and the coil array is disposed on the first surface of the stage.

32. An exposure apparatus, comprising:

an optical system for imaging a pattern onto an article, the optical system comprising a frame;

a stage device for positioning of the article relative to the optical system for imaging, comprising:

a stage movable relative to the optical system and having a first surface and a second surface, the second surface being adapted for supporting the article;

a magnet array having magnets with magnetic fields, the magnets being disposed in a plane; and a planar coil array positioned adjacent to the magnet array and operable to interact with the magnetic fields to provide a force between the coil array and the magnet array in a first, second and third direction, the first and second directions being generally parallel to the plane and the third direction being generally orthogonal to the plane, one of the magnet array and the coil array being attached to the frame and the other of the magnet array and the coil array being attached to the first surface of the stage, wherein the magnet array is disposed on the first surface of the stage, and the frame comprises a magnetically permeable material such that the magnet array and the frame interact to suspend the stage and the magnet array relative to the frame.

33. An exposure apparatus, comprising:

an optical system for imaging a pattern onto an article, the optical system comprising a frame having first and second surfaces;

a stage device for positioning of the article relative to the optical system for imaging, comprising:
  a stage movable relative to the optical system and having a first surface and a second surface, the second surface being adapted for supporting the article;
  a first magnet array having first magnets with first magnetic fields, the first magnets being disposed in a plane and attached to the first surface of the frame; and
  a first planar coil array positioned adjacent to the first magnet array and operable to interact with the first magnetic fields to provide a force between the first coil array and the first magnet array in a first, second and third direction, the first and second directions being generally parallel to the plane and the third direction being generally orthogonal to the plane, the first coil array being attached to the first surface of the stage;
a second planar magnet array having second magnets with second magnetic fields on the second surface of the frame; and
a second planar coil array disposed on the second surface of the stage, the second coil array being positioned adjacent to the second magnet array and operable to interact with the second magnetic fields to provide a second force between the second coil array and the second magnet array in the first, second and third directions.

34. The exposure apparatus of claim 33, wherein the force provided by the coil array and the magnet array and the second force provided by the second coil array and the second magnet array combine to position the stage relative to the frame.

35. An exposure apparatus, comprising:
an optical system for imaging a pattern onto an article, the optical system comprising a frame having first and second surfaces;
a stage device for positioning of the article relative to the optical system for imaging, comprising:
  a stage movable relative to the optical system and having a first surface and a second surface, the second surface being adapted for supporting the article;
  a first magnet array having first magnets with first magnetic fields, the first magnets being disposed in a plane; and
  a first planar coil array positioned adjacent to the magnet array and operable to interact with the first magnetic fields to provide a force between the first coil array and the first magnet array in a first, second and third direction, the first and second directions being generally parallel to the plane and the third direction being generally orthogonal to the plane, one of the first magnet array and the first coil array being attached to the first surface of the frame and the other of the first magnet array and the first coil array being attached to the first surface of the stage;
a second planar magnet array having second magnets with second magnetic fields on the second surface of one of the frame and stage; and
a second planar coil array disposed on the second surface of the other of the frame and stage, the second coil array being positioned adjacent to the second magnet array and operable to interact with the second magnetic fields to provide a second force between the second coil array and the second magnet array in the first, second and third directions, wherein the magnet arrays are disposed on one of the surfaces of the stage and one of the surfaces of the frame.

36. An exposure apparatus, comprising:
an optical system for imaging a pattern onto an article, the optical system comprising a frame having first and second surfaces;
a stage device for positioning of the article relative to the optical system for imaging, comprising:
  a stage movable relative to the optical system and having a first surface and a second surface, the second surface being adapted for supporting the article;
  a first magnet array having first magnets with first magnetic fields, the first magnets being disposed in a plane; and
  a first planar coil array positioned adjacent to the first magnet array and operable to interact with the first magnetic fields to provide a force between the first coil array and the first magnet array in a first, second and third direction, the first and second directions being generally parallel to the plane and the third direction being generally orthogonal to the plane, one of the first magnet array and the first coil array being attached to the first surface of the frame and the other of the first magnet array and the first coil array being attached to the first surface of the stage;
a second planar magnet array having second magnets with second magnetic fields on the second surface of the frame; and
a second planar coil array disposed on the second surface of the stage, the second coil array being positioned adjacent to the second magnet array and operable to interact with the second magnetic fields to provide a second force between the second coil array and the second magnet array in the first, second and third directions.

37. An electric motor, comprising:
a moving planar magnet array having an area and magnets with magnetic fields, the magnets being disposed in a plane; and
a stationary planar coil array having an area larger than the area of the magnet array, the coil array being positioned adjacent to the magnet array and operable to interact with the magnetic fields to provide a force between the coil array and the magnet array in a first and a second direction generally parallel to the plane, wherein the coil array has a first coil period in the first direction and a second coil period in the second direction and wherein the magnet array has a first magnet period in the first direction and a second magnet period in the second direction, the first coil period being less than the first magnet period and the second coil period being less than the second magnet period.

38. The electric motor of claim 37, wherein the coil array is positioned and operable to interact with the magnetic fields of the magnet array to provide a torque between the coil array and the magnet array about a third direction generally orthogonal to the plane.

39. The electric motor of claim 38, wherein said magnet array and said coil array interact to further provide a torque between the coil array and the magnet array about the first and second directions.

40. The electric motor of claim 37, further comprising a bearing attached to at least one of said magnet array and said coil array, said bearing supporting said magnet array relative to said coil array.

41. An electric motor, comprising:
a moving planar magnet array having an area and magnets with magnetic fields, the magnets being disposed in a plane, wherein the magnet array includes edge magnets disposed on a periphery of the magnet array and interior magnets disposed interior of the edge magnets, each edge magnet having a magnetic flux less than a magnetic flux of each interior magnet; and
a stationary planar coil array having an area larger than the area of the magnet array, the coil array being positioned adjacent to the magnet array and operable to interact with the magnetic fields to provide a force between the coil array and the magnet array in a first and a second direction generally parallel to the plane.

42. The electric motor of claim 41, wherein the magnetic flux of each edge magnet is approximately one half the magnetic flux of each interior magnet.

43. The electric motor of claim 41, wherein the magnet array has at least one corner and wherein the edge magnets include a corner magnet at each corner of the magnet array, the corner magnets having a magnetic flux less the magnetic flux of other edge magnets.

44. The electric motor of claim 43, wherein the magnetic flux of each edge magnet is approximately one half the magnetic flux of each interior magnet and the magnetic flux of each corner magnet is approximately one quarter the magnetic flux of each interior magnet.

45. A positioning device comprising:
a frame having a first surface;
a support having a first surface;
a moving magnet array having magnets with magnetic fields disposed in a plane on the first surface of the support;
a stationary coil array disposed on the first surface of the frame, the coil array being positioned adjacent to the magnet array and operable to interact with the magnetic fields to provide a force between the coil array and the magnet array in a first and second direction generally parallel to the plane; and
at least one air bearing attached to at least one of said frame and support, said air bearing movably supporting said magnet array and said coil array relative to each other generally in the third direction generally orthogonal to the plane.

46. The positioning device of claim 45, wherein the coil array is positioned and operable to interact with the magnetic fields of the magnet array to provide a torque between the coil array and the magnet array about a third direction generally orthogonal to the plane.

47. The positioning device of claim 45, wherein the coil array is positioned and operable to interact with the magnetic fields of the magnet array to provide a force in a third direction generally orthogonal to the plane.

48. The positioning device of claim 47, wherein the coil array is positioned and operable to interact with the magnetic fields of the magnet array to provide a torque about the first and second directions.

49. A positioning device comprising:
a frame having a first surface;
a support having a first surface;
a moving magnet array having magnets with magnetic fields disposed in a plane on the first surface of the support; and a stationary coil array disposed on the first surface of the frame, the coil array being positioned adjacent to the magnet array and operable to interact with the magnetic fields to provide a force between the coil array and the magnet array in a first and second direction generally parallel to the plane, wherein said frame and support are magnetically supported relative to each other, one of said frame and support including at least one support magnet and at least a portion of the other of the frame and support comprising a magnetically permeable material, the support magnet and the magnetically permeable material interacting to support the magnet array relative to the coil array.

50. The positioning device of claim 49, wherein the support is adapted to support a wafer, the support being magnetically suspended from the frame.

51. The positioning device of claim 49, wherein the support has a second surface opposing the first surface, the second surface of the support being adapted to support the wafer, wherein the magnet array is disposed on the first surface of the support.

52. A positioning device comprising:
a frame having a first surface;
a support having a first surface;
a moving magnet array having magnets with magnetic fields disposed in a plane on the first surface of the support, said magnet array including edge magnets disposed on a periphery of the magnet array and interior magnets disposed interior of the edge magnets, each edge magnet having a magnetic flux less than a magnetic flux of each interior magnet; and
a stationary coil array disposed on the first surface of the frame, the coil array being positioned adjacent to the magnet array and operable to interact with the magnetic fields to provide a force between the coil array and the magnet array in a first and second direction generally parallel to the plane.

53. The positioning device of claim 52, wherein the magnetic flux of each edge magnet is approximately one half the magnetic flux of each interior magnet.

54. The positioning device of claim 52, wherein the magnet array has at least one corner and wherein the edge magnets include a corner magnet at each corner of the magnet array, the corner magnets having a magnetic flux less the magnetic flux of other edge magnets.

55. The positioning device of claim 54, wherein the magnetic flux of each edge magnet is approximately one half the magnetic flux of each interior magnet and the magnetic flux of each corner magnet is approximately one quarter the magnetic flux of each interior magnet.

56. An exposure apparatus, comprising:
an optical system for imaging a pattern onto an article, the optical system comprising a frame;
a stage device for positioning of the article relative to the optical system for imaging, comprising:
a stage movable relative to the optical system and having a first surface and a second surface, the second surface being adapted for supporting the article;
a magnet array having magnets with magnetic fields, the magnets being disposed in a plane on the first stage surface, wherein the magnet array includes edge magnets disposed on a periphery of the magnet array and interior magnets disposed interior of the edge magnets, each edge magnet having a magnetic flux less than a magnetic flux of each interior magnet; and a planar coil array positioned on the frame adjacent to the magnet array and operable to interact with the magnetic fields to provide a force between the coil array and the magnet array in first and second directions generally parallel to the plane.

57. The exposure apparatus of claim 56, wherein the magnetic flux of each edge magnet is approximately one half the magnetic flux of each interior magnet.

58. The exposure apparatus of claim 56, wherein the magnet array has at least one corner and wherein the edge magnets include a corner magnet at each corner of the magnet array, the corner magnets having a magnetic flux less the magnetic flux of other edge magnets.

59. The exposure apparatus of claim 58, wherein the magnetic flux of each edge magnet is approximately one half the magnetic flux of each interior magnet and the magnetic flux of each corner magnet is approximately one quarter the magnetic flux of each interior magnet.

60. A method for positioning an object, comprising:
providing a planar magnet array having magnets with magnetic fields and disposing the magnets in a plane;
providing a planar coil array adjacent to the magnet array and with a first coil period in a first direction generally parallel to the plane and a second coil period in a second direction generally parallel to the plane and wherein providing the planar magnet array includes providing the magnet array with a first magnet period in the first direction greater than the first coil period and a second magnet period in the second direction greater than the second coil period; and
applying one or more currents to one or more coils of the coil array to interact with the magnetic fields to generate a force between the coil array and the magnet array in the first, second and a third direction, the third direction being generally orthogonal to the plane.

61. The method of claim 60, wherein the applying one or more currents further interacts with the magnetic fields to generate a torque between the coil array and the magnet array about the first, second and third directions.

62. The method of claim 60, further comprising providing a bearing attached to at least one of said magnet array and said coil array to support said magnet array relative to said coil array.

63. A method for positioning an object, comprising:
providing a planar magnet array having magnets with magnetic fields and disposing the magnets in a plane;
providing a planar coil array adjacent to the magnet array, such that the planar coil array has a first dimension in a first direction and a second dimension in a second direction and the magnet array includes a first dimension in the first direction less than the first coil dimension and a second dimension in the second direction less than the second coil dimension; and
applying one or more currents to one or more coils of the coil array to interact with the magnetic fields to generate a force between the coil array and the magnet array in the first, second and a third direction, the first and second directions being generally parallel to the plane and the third direction being generally orthogonal to the plane.

64. A method for positioning an object, comprising:
providing a planar magnet array having magnets with magnetic fields and disposing the magnets in a plane, wherein the magnets include edge magnets disposed on a periphery of the magnet array and interior magnets disposed interior of the edge magnets and having a magnetic flux greater than a magnetic flux of each edge magnet;
providing a planar coil array adjacent to the magnet array; and
applying one or more currents to one or more coils of the coil array to interact with the magnetic fields to generate a force between the coil array and the magnet array in a first, second and third direction, the first and second directions being generally parallel to the plane and the third direction being generally orthogonal to the plane.

65. A method for positioning an object, comprising:
providing a planar magnet array having magnets with magnetic fields and disposing the magnets in a plane, wherein the magnet array includes edge magnets and at least one corner, and providing a corner magnet at each corner of the magnet array having a magnetic flux less the magnetic flux of the edge magnets;
providing a planar coil array adjacent to the magnet array; and
applying one or more currents to one or more coils of the coil array to interact with the magnetic fields to generate a force between the coil array and the magnet array in a first, second and third direction, the first and second directions being generally parallel to the plane and the third direction being generally orthogonal to the plane.

66. A method for positioning a wafer in a lithography system, comprising:
providing a frame;
providing a stage for supporting the wafer and movable to position the wafer relative to the frame;
providing a planar magnet array having magnets with magnetic fields disposed in a plane and attached to one of the frame and stage;
providing a planar coil array adjacent to the magnet array and attached to the other of the frame and stage;
providing one of the frame and stage with at least one support magnet;
providing at least a portion of the other of the frame and stage with a magnetically permeable material such that the support magnet and the magnetically permeable material interact to support the magnet array relative to the coil array; and
applying one or more currents to one or more coils of the coil array to interact with the magnetic fields to generate a force between the coil array and the magnet array in a first, second and third direction, the first and second directions being generally parallel to the plane and the third direction being generally orthogonal to the plane.

67. The method of claim 66, wherein providing the stage includes providing a first stage surface and a second stage surface, the second stage surface being adapted for supporting the wafer and wherein one of the providing the magnet array and providing the coil array includes providing one of the magnet array and the coil array on the first surface of the stage.

68. The method of claim 67, wherein the providing the magnet array includes providing the magnet array on the first stage surface.

69. The method of claim 67, wherein the providing the frame includes providing at least a portion of the frame with a magnetically permeable material such that the magnet array and the magnetically permeable material interact to support the magnet array and the stage relative to the frame.

70. The method of claim 67, wherein the providing the coil array includes providing the coil array on the first stage surface.

71. The method of claim 67, wherein providing the frame includes providing a frame with a first surface having one of the magnet array and the coil array disposed thereon and a second surface, further comprising:

provide a second planar magnet array having second magnets with second magnetic fields disposed on the second surface of one of the frame and stage;

providing a second coil array adjacent to the second magnet array and disposed in a plane on the second surface of the other of the frame and stage; and applying one or more currents to one or more coils of the second coil array to interact with the second magnetic fields to generate a second force between the second coil array and the second magnet array in the first, second and third directions.

72. A method for positioning a wafer in a lithography system, comprising:

providing a frame;

providing a stage for supporting the wafer and movable to position the wafer relative to the frame;

providing a planar magnet array having magnets with magnetic fields disposed in a plane and attached to one of the frame and stage;

providing a planar coil array adjacent to the magnet array and attached to the other of the frame and stage;

providing an air bearing on the stage to suspend the stage relative to the frame; and applying one or more currents to one or more coils of the coil array to interact with the magnetic fields to generate a force between the coil array and the magnet array in a first, second and third direction, the first and second directions being generally parallel to the plane and the third direction being generally orthogonal to the plane.

73. A method for positioning a wafer in a lithography system, comprising:

providing a frame, including providing at least a portion of the frame with a magnetically permeable material such that the magnet array and the magnetically permeable material interact to support the magnet array and the stage relative to the frame;

providing a stage for supporting the wafer and movable to position the wafer relative to the frame, including providing a first stage surface and a second stage surface, the second stage surface being adapted for supporting the wafer and;

providing a planar magnet array having magnets with magnetic fields disposed in a plane and attached to one of the frame and stage;

providing a planar coil array adjacent to the magnet array and attached to the other of the frame and stage; and applying one or more currents to one or more coils of the coil array to interact with the magnetic fields to generate a force between the coil array and the magnet array in a first, second and third direction, the first and second directions being generally parallel to the plane and the third direction being generally orthogonal to the plane;

wherein one of the providing the magnet array and providing the coil array includes providing one of the magnet array and the coil array on the first surface of the stage.

74. A method for positioning a wafer in a lithography system, comprising:

providing a frame;

providing a stage for supporting the wafer and movable to position the wafer relative to the frame, including providing a first stage surface and a second stage surface, the second stage surface being adapted for supporting the wafer and;

providing a planar magnet array having magnets with magnetic fields disposed in a plane and attached to one of the frame and stage;

providing a planar coil array adjacent to the magnet array and attached to the other of the frame and stage, including providing the coil array on the first stage surface; and applying one or more currents to one or more coils of the coil array to interact with the magnetic fields to generate a force between the coil array and the magnet array in a first, second and third direction, the first and second directions being generally parallel to the plane and the third direction being generally orthogonal to the plane;

wherein one of the providing the magnet array and providing the coil array includes providing one of the magnet array and the coil array on the first surface of the stage.

* * * * *